United States Patent
Gressel et al.

(10) Patent No.: US 7,852,162 B2
(45) Date of Patent: Dec. 14, 2010

(54) PSEUDO RANDOM NOISE DEVICE BASED ON A RANDOM FREQUENCY MODULATED OSCILLATOR

(75) Inventors: Carmi David Gressel, Negev (IL); Avi Hecht, Haifa (IL); Ran Granot, Yavne (IL)

(73) Assignee: FortressGB (GB)

( * ) Notice: Subject to any disclaimer, the term of this patent is extended or adjusted under 35 U.S.C. 154(b) by 269 days.

(21) Appl. No.: 12/090,738

(22) PCT Filed: May 25, 2006

(86) PCT No.: PCT/IL2006/000627

§ 371 (c)(1),
(2), (4) Date: Jul. 7, 2008

(87) PCT Pub. No.: WO2007/049268

PCT Pub. Date: May 3, 2007

(65) Prior Publication Data

US 2008/0258825 A1 Oct. 23, 2008

Related U.S. Application Data

(60) Provisional application No. 60/730,555, filed on Oct. 27, 2005.

(51) Int. Cl.
*H03L 7/00* (2006.01)

(52) U.S. Cl. .................... 331/78; 332/120; 332/117; 375/130; 708/250; 708/251

(58) Field of Classification Search .......... 708/250, 708/251; 331/78; 332/117, 120; 375/130
See application file for complete search history.

(56) References Cited

U.S. PATENT DOCUMENTS

| 4,905,176 | A | 2/1990 | Schulz |
| 5,706,218 | A | 1/1998 | Hoffman |
| 6,795,837 | B1 | 9/2004 | Wells |
| 7,065,684 | B1 * | 6/2006 | Chan .................... 714/700 |
| 2003/0236802 | A1 | 12/2003 | Epstein |
| 2005/0205095 | A1 | 9/2005 | Dolezal et al. |

FOREIGN PATENT DOCUMENTS

WO 2005/101975 11/2005

OTHER PUBLICATIONS

Marsaglia, G., DieHard Tests, found at ftp://ftp.csis.hku.hk/pub/random/source, 2004 ("DieHard").

(Continued)

*Primary Examiner*—Arnold Kinkead
(74) *Attorney, Agent, or Firm*—Fleit Gibbons Gutman Bongini & Bianco, PL; Paul D. Bianco; Martin Fleit

(57) ABSTRACT

Random number generators are used for entertainment in gambling, lotteries and video gaming devices. True Random Number Generators, as are now currently defined, must be actuated by a physical noise source, typically based on the uncertainty of the phase differences of a stable and an unstable autonomous oscillator. In this invention an autonomous random frequency modulated oscillator driven by a self contained pseudo-random number generator outputs three loosely correlated random binary streams. Included in the invention is a hardware method for proving wandering phase differences and also the existence of a colored random distribution of concatenated nibbles.

23 Claims, 11 Drawing Sheets

OTHER PUBLICATIONS

Schindler, W, et al; AIS 31: Evaluation Criteria for TRNG Used in Cryptography, CHES 2002, LNCS Springer, Berlin, 2003, p. 431-449, hereinafter "C2002".

FIPS PUB 140-2, NIST, Federal Information Processing Standards Publication, 2001, pp. 1-3 (from www.wikipedia.org; last updated Dec. 3, 2002).

ETSI Spec No. TS 102 221 V3.0.F06921, 2000, hereinafter "ETSI".

W. Killmann, et al. AIS 31: Functionality Classes and Evaluation Methodology for Physical Random Number Generators. Version 1 (Sep. 29, 2001), www.bsi.bund.de/zertifiz/zert/interpr/ais31c.pdf, hereinafter "AIS 31", pp. 1-38.

Schindler, Efficient Online Test for True Random Number Gnerators, CHES 2001, p. 103-117 (mentioned in p. 7-12 of the specification).

International Search Report published May 3, 2007 for PCT/IL06/0627 filed May 25, 2006.

Written Opinion published Apr. 27, 2008 for PCT/IL06/0627 filed May 25, 2006.

International Preliminary Report on Patentability published Apr. 29, 2008 for PCT/IL06/0627 filed May 25, 2006.

FIPS PUB 140-2, NIST, Federal Information Processing Standards Publication, May 2001, pp. 1-69.

BSI, Application Notes and Interpretation of the Scheme, AIS 31, Version 1, Sep. 25, 2001, pp. 1-3.

Examination Report for application GB 0807774.5, dated Apr. 30, 2010.

* cited by examiner

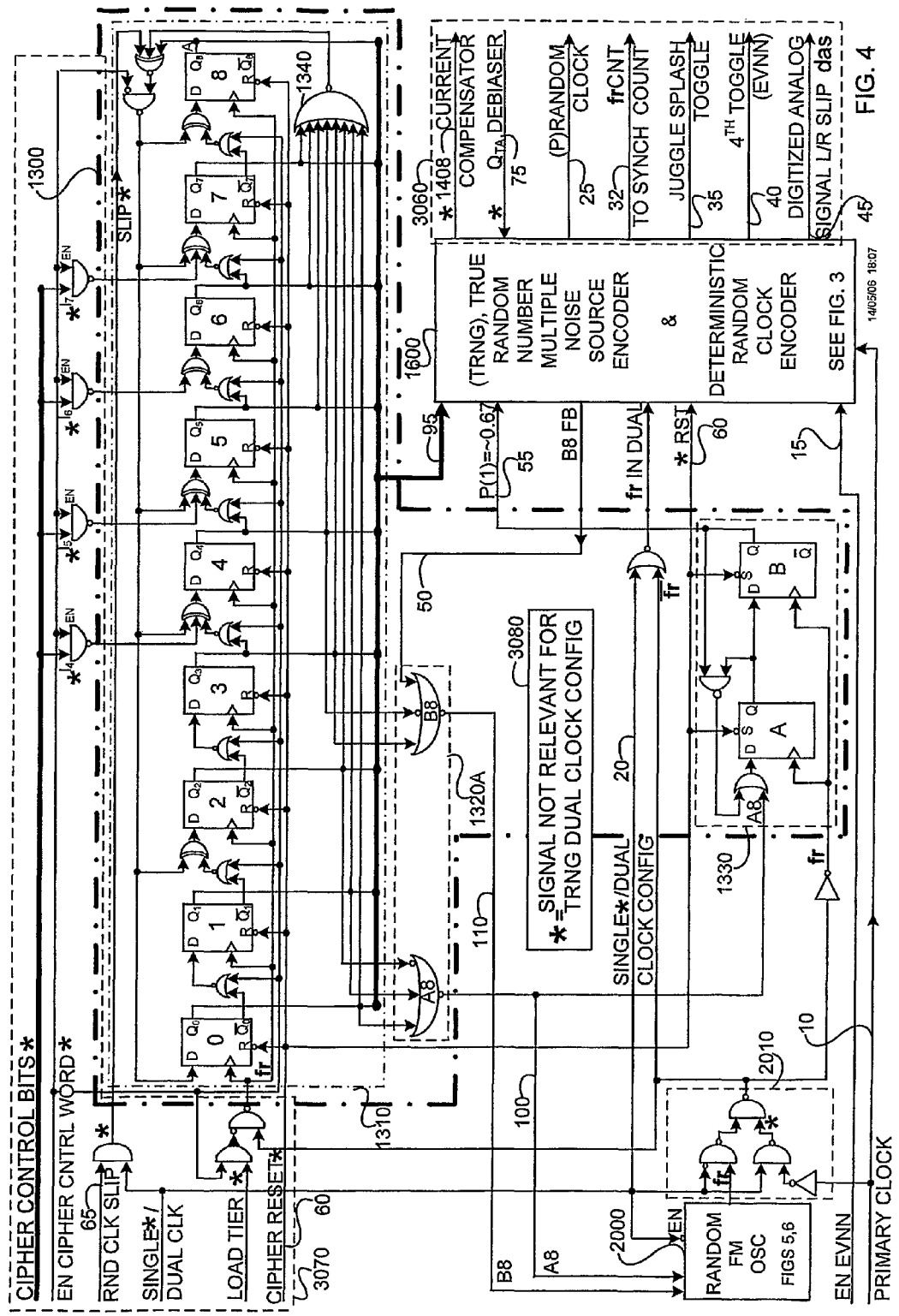

9Bit nLFSR 1,3,4,6,7,8

| | $Q_0Q_1Q_2Q_3Q_4Q_5Q_6Q_7Q_8$ | A | B | C | E | L | M |
|---|---|---|---|---|---|---|---|
| 0 | 1 1 1 1 1 1 1 1 1 | 1 | ⌐ | 1 | ⌐ | 1 | ⌐ |
| 1 | 1 1 0 1 0 0 1 0 0 | 1 | ⌐ | 1 | ⌐ | 0 | ⌐ |
| 2 | 0 1 1 0 1 0 0 1 0 | 0 | ⌐ | 1 | ⌐ | 1 | ⌐ |
| 3 | 0 0 1 1 0 1 0 0 1 | 1 | ⌐ | 0 | ⌐ | 1 | ⌐ |
| 4 | 1 0 1 1 0 1 1 1 1 | 1 | ⌐ | 1 | ⌐ | 1 | ⌐ |
| 5 | 1 1 1 1 0 1 1 0 0 | 1 | ⌐ | 1 | ⌐ | 0 | ⌐ |
| 6 | 0 1 1 1 1 0 1 1 0 | 0 | ⌐ | 1 | ⌐ | 1 | ⌐ |
| 7 | 0 0 1 1 1 1 0 1 1 | 1 | ⌐ | 0 | ⌐ | 1 | ⌐ |
| 8 | 1 0 1 1 0 0 1 1 0 | 1 | ⌐ | 1 | ⌐ | 1 | ⌐ |
| 9 | 0 1 0 1 1 0 0 1 1 | 1 | ⌐ | 1 | ⌐ | 1 | ⌐ |
| 10 | 1 0 0 0 0 0 0 1 0 | 1 | ⌐ | 1 | ⌐ | 0 | ⌐ |
| 11 | 0 1 0 0 0 0 0 0 1 | 0 | ⌐ | 1 | ⌐ | 1 | ⌐ |
| 12 | 1 0 0 0 1 1 0 1 1 | 1 | ⌐ | 0 | ⌐ | 0 | ⌐ |
| 13 | 1 1 1 0 1 0 1 1 0 | 0 | ⌐ | 1 | ⌐ | 1 | ⌐ |
| 14 | 0 1 1 1 0 1 0 1 1 | 1 | ⌐ | 0 | ⌐ | 1 | ⌐ |
| 15 | 1 0 0 1 0 1 1 1 0 | 1 | ⌐ | 1 | ⌐ | 1 | ⌐ |
| 16 | 0 1 0 0 1 0 1 1 1 | 1 | ⌐ | 1 | ⌐ | 1 | ⌐ |
| 17 | 1 0 0 0 1 0 0 0 0 | 1 | ⌐ | 1 | ⌐ | 0 | ⌐ |
| 18 | 0 1 0 0 0 1 0 0 0 | 0 | ⌐ | 1 | ⌐ | 1 | ⌐ |
| 19 | 0 0 1 0 0 0 1 0 0 | 1 | ⌐ | 0 | ⌐ | 1 | ⌐ |
| 20 | 0 0 0 1 0 0 0 1 0 | 1 | ⌐ | 1 | ⌐ | 0 | ⌐ |
| 21 | 0 0 0 0 1 0 0 0 1 | 0 | ⌐ | 1 | ⌐ | 1 | ⌐ |
| 22 | 1 0 1 0 1 0 0 1 1 | 1 | ⌐ | 0 | ⌐ | 0 | ⌐ |
| 23 | 1 1 1 1 1 0 0 1 0 | 0 | ⌐ | 1 | ⌐ | 1 | ⌐ |
| 24 | 0 1 1 1 1 1 0 0 1 | 1 | ⌐ | 0 | ⌐ | 1 | ⌐ |
| 25 | 1 0 0 1 0 0 1 1 1 | 1 | ⌐ | 1 | ⌐ | 1 | ⌐ |
| 26 | 1 1 1 0 0 1 0 0 0 | 1 | ⌐ | 1 | ⌐ | 0 | ⌐ |
| 27 | 0 1 1 1 0 0 1 0 0 | 0 | ⌐ | 1 | ⌐ | 1 | ⌐ |
| 28 | 0 0 1 1 1 0 0 1 0 | 1 | ⌐ | 0 | ⌐ | 1 | ⌐ |
| 29 | 0 0 0 1 1 1 0 0 1 | 1 | ⌐ | 1 | ⌐ | 0 | ⌐ |
| 30 | 1 0 1 0 0 0 1 1 1 | 0 | ⌐ | 1 | ⌐ | 0 | ⌐ |
| 31 | 1 1 1 1 1 1 0 0 0 | 1 | ⌐ | 1 | ⌐ | 1 | ⌐ |
| 32 | 0 1 1 1 1 1 1 0 0 | 0 | ⌐ | 0 | ⌐ | 0 | ⌐ |

FIG. 8

PSEUDO RANDOM NOISE DEVICE BASED ON A RANDOM FREQUENCY MODULATED OSCILLATOR

CROSS REFERENCE TO RELATED APPLICATIONS

This application claims the benefit under 35 U.S.C. 119(e) of U.S. provisional patent application No. 60/730,555, filed Oct. 27, 2005.

BACKGROUND OF THE INVENTION

Random number generators are used for entertainment in gambling, lottery and video gaming devices, and in scientific and mathematic testing, music composition, and cryptography. Traditional noise sources are typically based on allegedly uncorrelated binary oscillators wherein the host processor clock frequency or an analog low frequency oscillator samples a second or series of autonomous oscillators, which potentially interact thereby to produce a partially predictable signal.

SUMMARY OF THE INVENTION

The present invention relates to unpredictable provable colored random binary sequences to be processed in deterministic random number sequence generators, typified by FortressGB Ltd.'s ZK-Crypt combination True Random Number Generator, Stream Cipher and Hash and MAC Data Authenticators.

Random number generators are used for entertainment in gambling, lottery and video gaming devices, and in scientific and mathematic testing, music composition, and cryptography. The noise sources shown and described herein may be incorporated into the FortressGB Ltd. ZK-Crypt combination Random Number Generator/Stream Cipher/Data Authenticator, commercially available from FortressGB Ltd., BMA Building, Tavistock Square, London, which stores entropy and post-processes results to achieve highest quality statistical distributions. Traditional noise sources are typically based on allegedly uncorrelated binary oscillators wherein the Host processor clock frequency or an analog low frequency oscillator samples a second or series of autonomous oscillators, which potentially interact thereby to produce a partially predictable signal. Emerging specifications [such as AIS 31] demand inherent proof of uncertainty and provable sources of entropy, which are inherent in a preferred embodiment of the present invention.

Two separate frequency accelerator controllers randomly modulate the autonomous physically unstable oscillator frequency. The most forceful accelerator is actuated by a pseudo-noise generator for randomly encoded intervals, and the less intense frequency modulator (FM) is affected by a randomly encoded signal sampled by the uncorrelated Host clock. The four output entropic phase separated signals are used by a post processor to affect a plurality of permutations. An external counter sums the clock pulses from the wandering autonomous frequency in consecutive measured intervals to attest to the constantly changing random phase differences between the Host processor clock frequency and the noise clock frequency.

A double clock noise source constructed and operative in accordance with a preferred embodiment of the present invention is operative to activate logic permutations in the more than 300 binary variables in a deterministic pseudorandom post processing device. Typically, the double clock noise source shown as described herein is compatible with demands of the [AIS 31] specification for noise sources and is operates successfully with varied frequency ratio ranges between autonomous oscillators and system sampling clocks. The method of ascertaining proper operation of the unit compared to the [C2002] method, as shown and described herein, is faster and makes fewer demands from the Host processor. The device, operating at 100 MHz., arguably outputs more than 2 bits of entropy at every clock cycle. Consequently the noise source is capable of loading hundreds of millions of bit entropy, compressed in the variables of the pseudorandom post processor in less than a tenth of a second, which is a reasonable initialization interval.

In many applications this integrated noise source is used to establish "high entropy" random initial conditions compressed in the post processor, in a first phase, followed by a second phase in which the FM oscillator replaced by the Host driven clock drives the "deterministic random number generator" post processor to breed virtually endless unpredictable strings. In such cases, the "noise" generator of the present invention becomes a pseudo random clock driving the 300 binary variable pseudo-random deterministic random number generator post processing device, with the FM oscillator disabled, wherein "pseudo-randomness" data generated in the post-processor is simultaneously fed back into the noise generator.

Consequently, the postprocessor, after being loaded with entropy, can be considered "seeded", and can be operated in a Single Clock configuration, in which the post-processor is operative to output hundreds of thousands of 32 bit words of random numbers, which pass the most rigorous statistic tests [DieHard]. This is especially important for wireless devices, as present mobile phone specifications [ETSI] demand that there be no autonomous oscillator on a mobile phone which may interfere with transmission and receipt of wireless messaging. Additionally, the number of transistors operating (hence generating electronic noise, much of it DC) in the noise source shown and described herein, is typically far smaller than in competing devices. For telephone operators, the noise generated by the compact device shown and described herein is considered to be irrelevant.

The post processor is typically used in devices operating at frequencies which may be slightly higher or hundreds of times slower than the average operating frequency of the autonomous clock, which typically is fixed in the silicon fab to be in the range of five to five hundred megahertz. The typically unsurpassed output binary bias statistics of the 3 randomly toggled noise sources of this invention are in the range of 0.48 to 0.52 bias to "1", for ratios of noise frequency to (Host supplied) sampling frequency of 0.9 to 150. Low energy battery operated applications typically require lower frequency FM autonomous oscillators.

The FM Random Clock's 5 non-linear outputs randomality is typically based on an unpredictable phase relation of each of the five output signals to the Host supplied system clock, and also to the unpredictable phase relationship between each of the five output signals where the Primary Clock samples random signals generated by a randomized wandering frequency clock. The noise source is free running, with no outside input, save the Host clock, which samples the encoder at intervals, in two consecutive encoded stages.

The digital logic of the noise source supplies 9 random binary signals to an encoder, and also influences two random signals which regulate FM logic accelerator controls. These signals may constantly change the output frequency of the autonomous oscillator for random intervals to one of four unstable frequency ranges.

A biased binary signal is said to have a "distinct" bias to "1" or "0" when, measured in "fairly long" sequences. The biased probability of a "1" is either less than 0.48 or more than 0.52. An unbiased binary signal is defined as a stream of "1"s and "0"s each having a probability of occurrence close to 0.5.

When a colored random binary signal (an encoded logic signal) is XORed (exclusive ORed) to a poorly correlated unbiased signal (the random frequency signal with a duty cycle of very close to 50%), the resulting signal is an unbiased signal. If the sampling clock has a constantly changing phase relation to the encoded signal, then the output is a "debiased" random signal. Typically, the four encoded signals, even after encoding and debiasing are slightly correlated. To surmount this anomaly, a similar strategy of debiasing second stage signals, re-encoding and sampling to correlation immunize the resulting signals before emission, may be employed.

Exclusive ORing an unbiased signal with an uncorrelated biased signal typically outputs unbiased signals in relatively short strings, and with little measurable bias in very long sequences.

This random oscillator frequency, fr, drives the digital logic of the noise source, and also debiases three of the encoded sets of random signals. One of the three signals is sampled as debiased, a second signal is delayed slightly before being sampled by the Host clock (the Primary Clock), and the third debiased signal is delayed even longer, and is the only feedback source of randomality affecting the frequency of the modulated oscillator. The result at the intermediate sampling is that three signals which may have had minimal correlation, would have even less, as, typically, at least one of the signals will be complemented by the fr signal.

The fourth output signal is a jittered or more accurately, a missing clock signal, which in the ZK-Crypt drives three permutation control units. Randomly this signal typically removes slightly more than one in 6 Primary Clock pulses from the activating sequence of these three permutation control activating units.

The three debiased, (and now typically less biased) encoded and Primary Clock sampled signals are further encoded into three new signals, to be XOR debiased again by the fr signal. Note that typically fr, the random FM output has an even chance, at the instant of sampling, to be a "1" or a "0", practically Markovian (the chances of it being sampled a "1" or a "0" are 50% at any sampling independent of the known result of a previous sample.)

The noise generator configuration shown and described herein is believed to be AIS 31 acceptable, being virtually independent of the frequency ratio of the Primary Clock to the random fr oscillator outputs, and operative to prove, on line the randomness of the noise source.

In this invention, four signals emanate from the Noise Source operative to control permutations in a deterministic random number generator. The (P)Random Clock which randomly deletes less than one fourth of the clock signal to the permutation control units, and three permutation controller signals, the Juggle Splash Toggle, the 4th Toggle EVNN, and the das signal which are targeted to issue a logic "1" signal with a probability approaching 0.5.

Results of three unaltered analytical tests are now described, where the relationships between the random FM average frequency and the sampling Primary Clock (typically stable hardware System Clock) frequency were separated by a ratio of up to 300, using the methods suggested in [C2002] and using our simpler counting method. In typical silicon applications, where the propagation delays are functions of transistor temperatures and supply voltage, ranging from plus to minus 20% of the nominal average value, in millisecond intervals, more ideal results may be expected.

The methods described in [C2002] are fairly complicated for use in 8 bit microcontroller applications. The on-line test shown and described herein is simpler and can be enacted without loss of computing time, which is typically preferable in constrained computing and power applications. This on-line testing method may be optimally enacted whilst the post processor is being initialized, ("loaded" with entropy), utilizing a cipher synchronization counter in the post processor which is not active in non-deterministic true random functions.

If the frequency of the autonomous oscillator wanders, the number of clock pulses emitted during a small fixed interval, e.g., the period of one Primary Clock, also wanders. The changing phase between the rising clock pulses of the two clocks corresponds to the randomness of the sampled signals. This is typically marked when the frequency ratios are large, but is also detected when the Primary Clock frequency is less than the fr signal frequency, i.e., one or two fr pulses will be detected, or slightly faster, when no pulse or one pulse will be detected. This test can accommodate the test criteria in the AIS 31 spec, such that:

a) proof that the noise source is activated and minimally functioning, b) the noise source generates a satisfactory binary distribution, and c) that only if three successive [C2002] failures occur, and also no phase changes have provably occurred for 30 primary clock cycles then, and only then, there is reason to stop the test suite, and there is reason to demand manual rectification, as prescribed in AIS 31.

Such manual rectification can be averted typically, when poor statistics are generated, as the FM Alarm delay shunt raises the average fr frequency to a higher range.

The wandering phase test shown and described above can be executed in addition to the online tests specified by [C2002] for which provision has been made. In the present implementations of this device, the five output signals from the "Noise Source" are typically simultaneously output onto the Host interface.

The [C2002] "entropy" online test procedure for testing a noise source includes the following steps:

a) ascertain that the noise source shows "signs of life"; e.g., the das signal 45 pulsates.

b) sample 320 bit string of non overlapping output bits from the noise source (preferably while simultaneously sampling a random string in the post processor), c) parse the 320 bit string into (4 bit) nibbles d) count the number of each value nibbles, into "cx boxes"; c0 to c15 e) compute a mark of demerit (MD) of the distribution of box values f) if the mark of demerit is larger than 65—raise a danger flag g) ascertain that before another k more tests that the danger flag has not been raised; if raised; cease and desist h) continue for a defined number of test procedures.

107 three parallel "unbiased triplet outputs" are concatenated to simultaneously test the three unbiased sources of entropy in 320 bit strings.

A "perfect" even distribution (which typically never occurs in practice) would have 5 nibbles in each box. Therefore the measured aberration from the preferred norm for each box is the square of (cx−5), the number of nibbles in the box minus 5 which is squared to a positive integer. $(cx-5)^2$, typically is less than 50, e.g., cx is less than 12.

If the sum of the 16 aberrations divided by five is larger than 65, then, and only then, a warning is deemed to have been detected, as described in [C2002]. The present simulated designs were tested on tens of millions samples (Primary Clock cycle samplings of 320 binary outputs). The duty cycles (the percentage of time on "1" in a cycle of fr, the FM oscillator) was set in increments of 1%, from 48% to 52% for each set of six tests on 1 million samples. The average frequency of fr ranged 150 times to 0.9 times of the frequency of the Primary Clock sampling signal. Using the present configuration, no test result approached an alarm value, e.g., a single MD equal to or above 65. Obviously, a failure never occurred, a repeated MD within a test. In the recorded tests, the MD never exceeded or equaled 30. MDs seem to be slightly better with higher average fr frequencies. It is difficult to find a significant correlation between the fr duty cycle and MD grades.

The highest MD that was detected on a sampling test of 320 concatenated binary bits occurred with an fr duty cycle of 48% with the fr average frequency double the host Primary Clock frequency; see the Sample 320 bit test A. Sample B's configuration is the same, with the fr average frequency 0.9 times (slower) than the host Primary Clock frequency; see Sample 320 bit test B. In order to lower energy, setting the average fr frequency range to between slightly less than the Primary Clock frequency to up 3 times the Primary Clock frequency is suggested.

| 8 Distributions using the [C2002] Entropy Test on Sample 320 bit tests A & B | | | | | | | |
|---|---|---|---|---|---|---|---|
| Sample A Hi (Double Frequency) 4 Tests | | | | Sample B Lo(0.9 Frequency) 4 Tests | | | |
| Box | 1st | 2nd | 3rd | 4th | 1st | 2nd | 3rd | 4th |
| c0 | 9 | 8 | 4 | 9 | 7 | 3 | 6 | 4 |
| c1 | 4 | 5 | 3 | 10 | 6 | 2 | 4 | 4 |
| c2 | 4 | 9 | 7 | 10 | 4 | 6 | 7 | 4 |
| c3 | 2 | 5 | 4 | 3 | 4 | 6 | 5 | 6 |
| c4 | 12 | 5 | 1 | 2 | 5 | 4 | 6 | 8 |
| c5 | 1 | 5 | 5 | 4 | 6 | 5 | 3 | 0 |
| c6 | 4 | 3 | 9 | 2 | 3 | 7 | 7 | 6 |
| c7 | 5 | 3 | 4 | 3 | 4 | 5 | 5 | 5 |
| c8 | 1 | 3 | 4 | 2 | 3 | 7 | 6 | 6 |
| c9 | 4 | 7 | 8 | 4 | 6 | 2 | 4 | 2 |
| c10 | 5 | 4 | 6 | 7 | 3 | 6 | 8 | 6 |
| c11 | 10 | 7 | 2 | 4 | 9 | 4 | 2 | 9 |
| c12 | 4 | 3 | 6 | 4 | 3 | 8 | 1 | 8 |
| c13 | 4 | 8 | 6 | 8 | 4 | 4 | 5 | 4 |
| c14 | 4 | 2 | 5 | 3 | 9 | 3 | 7 | 2 |
| c15 | 7 | 3 | 6 | 5 | 4 | 8 | 4 | 6 |
| MD | 28.4 | 14.4 | 13.2 | 24.4 | 12.0 | 11.6 | 11.2 | 17.2 |

In the following listing, the (P)Random Clock's expected probability of occurrence of a "1" is (⅚+ε)=0.8356. The 3 toggle signals' 35, 40 and 45 expected probability of "1" is 50%.

| Bias (number of "1"s in 1M sample cycles) of the Hi & Lo, A & B frequencies | | | |
|---|---|---|---|
| Output Signal | Sample A | Sample B | Expected Average Value |
| (P)Random Clock | 861295 | 838008 | 835600 |
| a-4th Toggle EVNN | 487383 | 500018 | 500000 |
| b-Juggle Hash Toggle | 496147 | 499996 | 500000 |
| c-das | 496721 | 471973 | 500000 |

Slightly better average results would be achieved under normal circumstances where the Host typically samples at an estimated rate of one in eight Primary Clocked samples.

There is an appreciable difference in the bias of the signal outputs a, b, and c in the above table, e.g., the c-das signal in Sample B is less than a minimum expected probability of "1"s, e.g., 48%, whereas, if the signals were averaged, each signal would have an estimated probability of 49% "1"s.

Therefore in preferred embodiments a balancing of the bias outputs of the three toggled is being embodied (not shown in the drawings) to reduce localized temporary biasing of one or two of a, b or c; i.e., a-4th Toggle EVNN, the b-Juggle Hash Toggle, or the c-das outputs. This is accomplished by rotating the toggled outputs at each fr 30 autonomous oscillating clock signal, e.g., the a-4th Toggle EVNN output would then comprise of a, b, c, a, b, c, . . . ; whilst the Juggle Hash Toggle output would then comprise of b, c, a, b, c, a . . . ; and the das signal on line 45 would simultaneously then comprise of C, a, b, c, a, b . . . .

There is thus provided, in accordance with a preferred embodiment of the present invention, noise source apparatus operative in conjunction with host apparatus which at intervals generates a signal to sample at least one output variable at a host sampling frequency; the apparatus comprising a frequency modulated oscillator operating at a plurality of levels of frequency and having a metastable output frequency, the oscillator being operative to generate at least one at least almost unbiased signal; a frequency modulator circuit operative to control the plurality of levels of frequency of the frequency modulated oscillator by generating oscillator input signals, and to receive therefrom, and encode, the at least one at least almost unbiased signal, thereby to generate at least one output variable which comprises an encoded form of the at least one at least almost unbiased signal, for sampling by the host apparatus; and at least one logic circuit with at least one binary output operative to program a random frequency modulator circuit. Such circuitry may be used as a standalone TRNG for many applications.

There is also provided, in accordance with another preferred embodiment of the present invention, noise source apparatus operative in conjunction with host apparatus comprising a host supplied sampling clock which at intervals generates a signal to sample at least one output variable at a host sampling frequency, the apparatus comprising a randomly activated deterministic pseudorandom number generating device operative to generate a first plurality of randomized binary streams, a frequency modulated oscillator operating at a second plurality of binary metastable frequency levels, at least some of which are uncorrelated to the host supplied sampling clock, the oscillator being operative to activate the pseudorandom number generating device, a frequency modulator circuit which is controlled by the pseudorandom number generating device and which generates oscillator input signals which define random intervals in the course of which the oscillator switches between its second plurality of binary frequency levels; and an encoding-sampling device receiving, encoding and sampling, in accordance with the host supplied sampling clock, the first plurality of randomized binary streams, thereby to generate an encoded sampled output and feeding back an intermediate fed-back signal to the randomly activated deterministic pseudo-random number generating device.

Further in accordance with a preferred embodiment of the present invention, the encoding-sampling device comprises a double-encoding double-sampling device receiving, double-encoding and double-sampling the first plurality of randomized binary streams.

Still further in accordance with a preferred embodiment of the present invention, the double-encoding double-sampling device comprises digital logic and an array of buffers serving the digital logic operative to encode, debias and sample and then re-encode, re-debias and re-sample the first plurality of randomized binary streams.

Additionally in accordance with a preferred embodiment of the present invention, the at least two host-clock sampled signals are further encoded and further complemented by the oscillator output and are again sampled by the host clock and are output to activate permutations in the deterministic pseudorandom number generator.

Still further in accordance with a preferred embodiment of the present invention, the oscillator is operative to debias samples within the first plurality of randomized binary streams before the samples are encoded by the encoding-sampling device.

Further in accordance with a preferred embodiment of the present invention, the oscillator is operative to debias samples within the first plurality of randomized binary streams after the samples are encoded by the encoding-sampling device.

Still further in accordance with a preferred embodiment of the present invention, the metastable output frequency is in a range of from less than two to at least 150 times higher than the host sampling frequency.

Additionally in accordance with a preferred embodiment of the present invention, each of the second plurality of binary metastable frequency levels is in a range of from less than two to at least 150 times higher than the host sampling frequency.

Further in accordance with a preferred embodiment of the present invention, the apparatus also comprises a delay circuit operative to phase shift at least one of the two encoded signals thereby increasing phase difference between the oscillator output, the encoded signals and the host clock signals.

There is also provided, in accordance with still another preferred embodiment of the present invention, missed signal clock apparatus operative in conjunction with a host sampling device having a host clock, the apparatus comprising a metastable clock generating an at least almost unbiased metastable clock output; a first digitized logic circuit driven by the metastable clock output which generates a first random binary string comprising at least one encoded binary signal with an approximate probability of one half; a second digitized logic circuit driven by the metastable clock output which generates a second random binary string comprising a sequence of lone zeroes each followed by a set of at least two consecutive binary ones, wherein the sequence of sets of at least two ones comprises sets of exactly two ones randomly interspersed with sets of more than two ones; and synchronization circuitry operative to combine the first and second random binary strings by outputting a binary one if at least one of the corresponding elements of the binary strings is a one; and outputting a zero if both of the corresponding elements of the binary strings are in a zero state, thereby to generate a combined output comprising more than two-thirds of binary ones, and to synchronize the combined output to the host clock.

Further in accordance with a preferred embodiment of the present invention, the frequency modulator circuit is operative to generate switch-shunting control signals and wherein the frequency modulated oscillator comprises an odd number of concatenated logic inverters defining an instantaneous propagation interval, at least some of which are randomly switch-shunted by the control signals, thereby lowering the instantaneous propagation interval and increasing the instantaneous frequency of the frequency modulated oscillator.

Still further in accordance with a preferred embodiment of the present invention, the frequency modulated oscillator comprises a logic inverter; and a plurality of concatenated delay circuits, connected in a ring and defining a total propagation time of a binary signal traveling through the ring, wherein the ring is closed at one point by the logic inverter, wherein at least one of the plurality of concatenated delay circuits is switch shunted thereby to reduce the total propagation time and to increase the instantaneous frequency of the frequency modulated oscillator.

Further in accordance with a preferred embodiment of the present invention, the frequency modulated oscillator comprises a digital to analog circuit emitting a first voltage at least if all of the oscillator inputs are at logic zero and emitting a second voltage at least if all of the oscillator inputs are at logic one; and a voltage to frequency converter generating metastable outputs which are a function of at least the oscillator inputs.

There is further provided, in accordance with another preferred embodiment of the present invention, a method for ascertaining operation of an oscillator operating in conjunction with a host supplied sampling clock, the method comprising counting a number of pulses generated by the oscillator which occur within each of a sequence of time intervals of a fixed length, the fixed length being an integer multiple of half of the period of the host supplied sampling clock; and generating an oscillator operation check output which indicates whether or not the number of pulses occurring within the time intervals, varies.

There is also provided, in accordance with still another preferred embodiment of the present invention, apparatus for ascertaining operation of an oscillator operating in conjunction with a host supplied sampling clock, the apparatus comprising a pulse-per-interval counter operative to count a number of pulses generated by the oscillator which occur within each of a sequence of time intervals of a fixed length, the fixed length being an integer multiple of half of the period of the host supplied sampling clock; and an oscillator operation verifier operative to generate an oscillator operation check output which indicates whether or not the number of pulses occurring within the time intervals, varies.

There is also provided, in accordance with another preferred embodiment of the present invention, a noise generating method operative in conjunction with host apparatus which at intervals generates a signal to sample at least one output variable at a host sampling frequency; the method comprising using a frequency modulated oscillator operating at a plurality of levels of frequency and having a metastable output frequency to generate at least one at least almost unbiased signal, using a frequency modulator circuit to control the plurality of levels of frequency of the frequency modulated oscillator by generating oscillator input signals, and to receive therefrom, and encode, the at least one at least almost unbiased signal, thereby to generate at least one output variable which comprises an encoded form of the at least one at least almost unbiased signal, for sampling by the host apparatus; and using at least one logic circuit with at least one binary output to program a random frequency modulator circuit.

There is further provided, in accordance with still another preferred embodiment of the present invention, a noise generating method operative in conjunction with host apparatus comprising a host supplied sampling clock which at intervals generates a signal to sample at least one output variable at a host sampling frequency, the method comprising using a randomly activated deterministic pseudorandom number generating device operative to generate a first plurality of randomized binary streams, operating a frequency modulated oscillator operating at a second plurality of binary metastable frequency levels, at least some of which are uncorrelated to the host supplied sampling clock and using the oscillator to activate the pseudorandom number generating device, controlling a frequency modulator circuit using the pseudorandom number generating device and generating oscillator input signals which define random intervals in the course of which the oscillator switches between its second plurality of binary frequency levels; and receiving, encoding and sampling, in accordance with the host supplied sampling clock, the first plurality of randomized binary streams, thereby to generate an encoded sampled output and feeding back an intermediate fed-back signal to the randomly activated deterministic pseudo-random number generating device.

Further provided, in accordance with another preferred embodiment of the present invention, is a method for clocking missed signals operative in conjunction with a host sampling device having a host clock, the method comprising generating an at least almost unbiased metastable clock output, using a first digitized logic circuit driven by the metastable clock output, generating a first random binary string comprising at least one encoded binary signal with an approximate probability of one half, using a second digitized logic circuit driven by the metastable clock output, generating a second random binary string comprising a sequence of lone zeroes each followed by a set of at least two consecutive binary ones, wherein the sequence of sets of at least two ones comprises sets of exactly two ones randomly interspersed with sets of more than two ones; and combining the first and second random binary strings by outputting a binary one if at least one of the corresponding elements of the binary strings is a one; and outputting a zero if both of the corresponding elements of the binary strings are in a zero state, thereby to generate a combined output comprising more than two-thirds of binary ones, and to synchronize the combined output to the host clock.

BRIEF DESCRIPTION OF THE DRAWINGS

FIG. 4 depicts the Random Modulator 1300 of the physical frequency modulated oscillator 2000 in the TRNG Dual Clock configuration of FIG. 2B, the random modulator 1300 being operative in both Single and Dual Clock configurations to generate pseudo-random or colored random sequences, respectively.

FIG. 5 is equivalent to figures in "555", except that a switching delay to prevent glitching all switch shunting of delay components will be performed during the interval that switched signals are at logic "0" to prevent glitches.

FIG. 8 is a table of the first 32 out of 512 stages (starting with the all "1" stage) of the one to many extended linear feed shift registers (the all one stage is inserted in the sequence), eLFSR shown in the Random Modulator of FIG. 4, wherein each of the three eLFSR triplets are encoded in A, C and L, and shown after debiasing by oscillator output fr and delayed prior to sampling at points B, E, and M.

DETAILED DESCRIPTION OF PREFERRED EMBODIMENTS

In the following explanation, signals and the conducting lines on which the signals propagate are designated interchangeably by the same indexing number; e.g., the Primary Clock pulses appear on line 10, wherein 10 also designates the Primary Clock signal.

Figure 1:
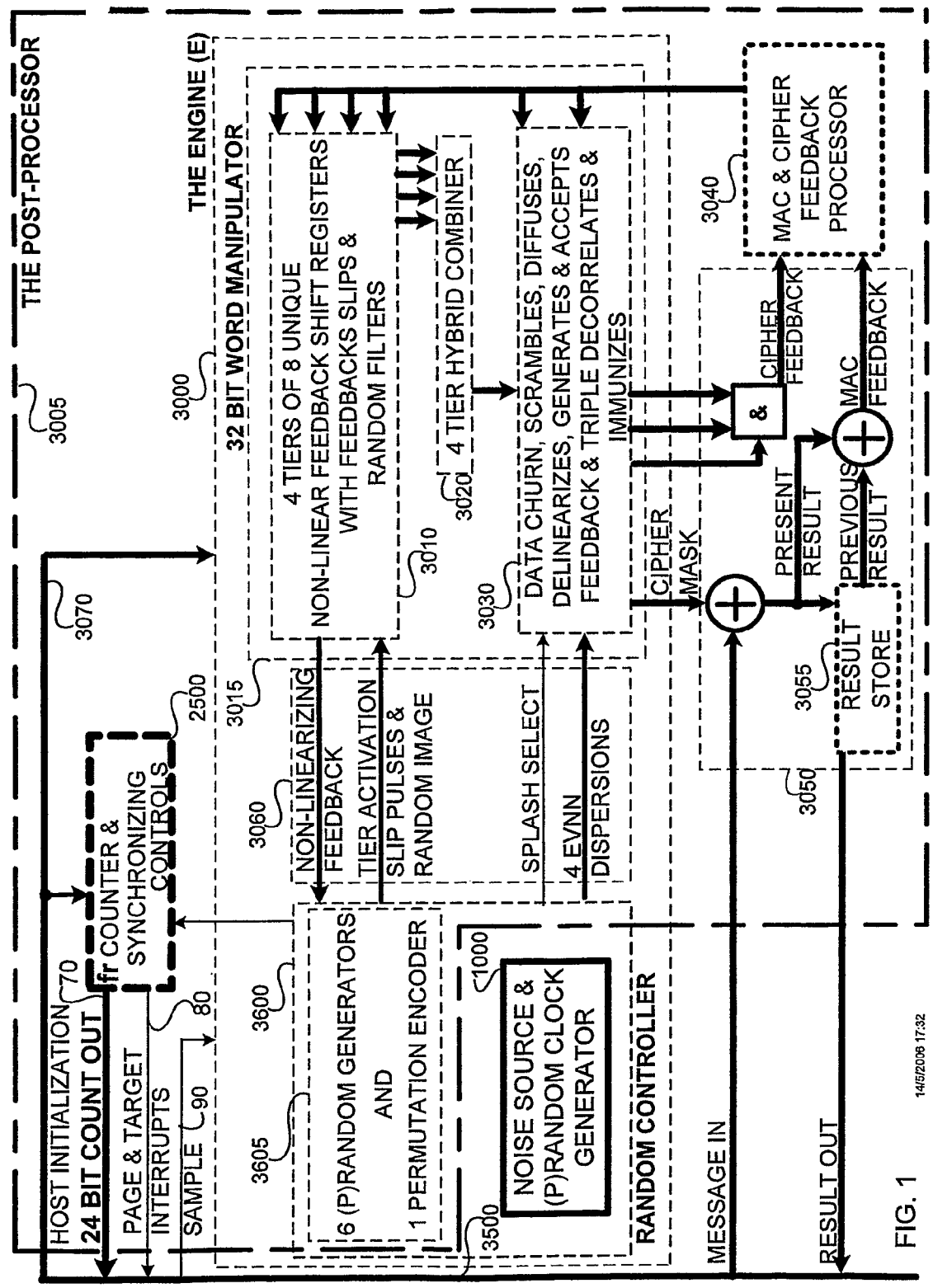
FIG. 1 is a block diagram which illustrates the place of a noise source/pseudo-random clock, constructed and operative in accordance with a preferred embodiment of the present invention, in the Random Controller of the ZK-Crypt combination True Random Number Generator/Stream Cipher/Data Authenticator, aka, TRNG/SCE/MAC respectively.

FIG. 1 is a block diagram which illustrates the place of the noise source/pseudo-random clock 1000 relative to the Random Controller 3600 of the ZK-Crypt combination True Random Number Generator/Stream Cipher/Data Authenticator, aka, TRNG/SCE/MAC respectively. The random controller 3600 preferably includes the combination noise and pseudo-random clock 1000 and the pseudo noise generators 3605. Noise source 1000 is the physically generated binary noise source when operated in a Dual Clock configuration described with reference to the following figures, and is a source of pseudorandom noise when operated in a Single Clock configuration. The Engine 3000 is a unit which generates true random and pseudorandom binary sequences, relative to the configurations commanded and initialized by the Host 3500. The largest component of the device is the 32 Bit Word Manipulator 3015 comprising the data register with filters and feedback shift registers, 3010, and a logic combiner having four tiers of shift registers which are activated and permuted by the Random Controller, 3600. A filtering combiner 3020, operating on the 4 tiers outputs data to the Data Churn. The Data Churn 3030 scrambles, diffuses, correlation immunizes, delinearizes, and generates and accepts processed feedback in pre-processor 3050, and selected and transmitted via the MAC and Cipher Feedback processor 3040. When used as a cryptographic device, preprocessor 3050 handles data input, and outputs data to Result Store 3055. When used as a TRNG, Sampled data only is emitted on the Result Out bus.

Activating shift register and permutation signals passing from the controller 3600 to the Manipulator 3015; and feedback from Random Data in 3010, are both interfaced via input output block 3060.

The Host 3500 initializes the Engine 3000 for cryptographic functions and initializes the Synch Counter 2500 to synchronize senders and receivers for ciphering, and configures the Engine for the three functions via bus 3070. Counter 2500 is operative in a Dual Clock configuration to count and output a count signal on counter outputs on bus 70 the number of random noise pulses, emitted internally from noise source 1000, thereby to ascertain the wandering frequency emitting from the ring oscillator complex 2000 in FIG. 2A in defined periods. The Synch Controller 2500 optionally interrupts the Host 3500 on signal line 80 typically after a predetermined number of 32 bit words have been output to result store 3055.

The Synchronizing Controller 2500 in FIG. 1 includes a counter which in the Dual Clock configuration, is operative to count fr pulses emanating from the FM Oscillator. If in a given interval, fr pulses are detected, this is typically deemed sufficient proof that the Oscillator is operating, i.e., that the Random Clock is feeding permutating signals into the Random Controller 3600. If in at least some same length intervals, the count varies, e.g., in single primary clock intervals, we detect 27, 21, 25, 24, 27, 26, 23 fr pulses, this is seen to prove that there are ongoing phase differences between the Random Clock and the Primary Clock signals, causing ongoing phase differences between the sources of the four signals emanating from the Random Clock.

In addition, in order to support compliance with the [C2002] suggested methods of testing, all of the FM Random Clock Signals are typically output to the Host 3500. Users may choose a combination of tests from a variety of statistical tests which may for example include the simple count mechanism which proves wandering phase difference.

Figure 2A:
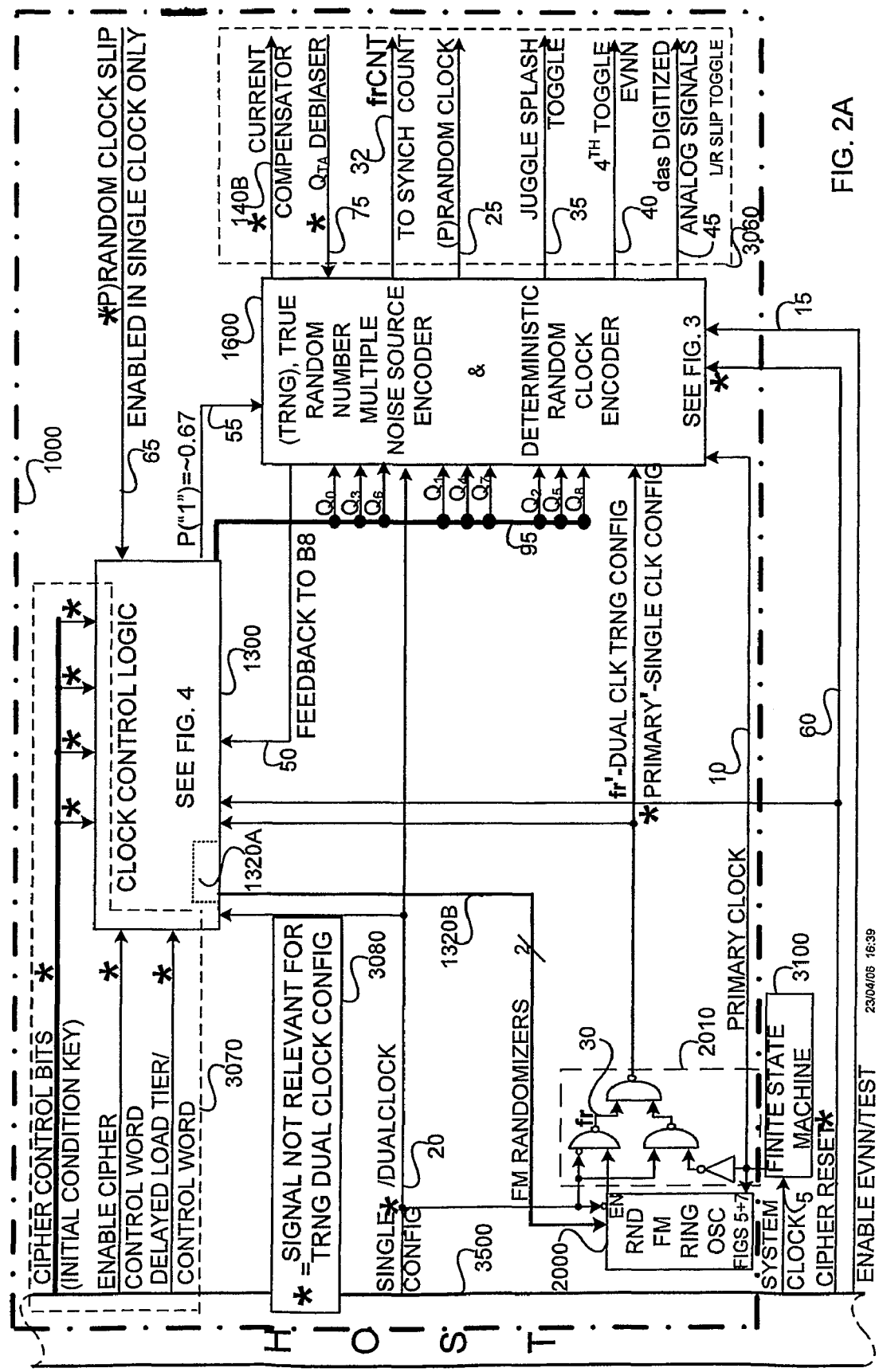
FIG. 2A is a block diagram of a ZK-Crypt Configurable Clock module which is constructed and operative in accordance with a preferred embodiment of the present invention, showing configurations for Single Clock deterministic operation and for Dual Clock true random generation. Single Clock mode refers to deterministic operation wherein clock signals are derived from the Host 3500. Dual Clock mode refers to a second on board clocking device whose frequency typically is not synchronized to a multiple of the frequency of Host derived clock.

FIG. 2A is a block diagram of the ZK-Crypt Configurable Clock module, constructed and operative in accordance with a preferred embodiment of the present invention.

In Dual Clock mode, the five relevant output signals:

i. are fr 30 the output sent to the Synchronizing Counter 2500 in FIG. 1 to prove the wandering relationship between fr 30 and the Host 3500 activated Primary Clock 10;

ii. the (P)Random Clock 25 which misses a Primary Clock activation pulse about 16% of the time on average, while activating control units and three unbiased permutation signals to the Data Manipulator 3015 and to the (P)Random Generators and the Permutation Controller in the Random Controller 3600;

iii. via the Random Controller encoders, the Juggle Splash Toggle 35 regulates displacement vectors;

iv. the 4th Toggle 40 which randomly complements signals in the Data Churn 3030; and, v. the das (Digitized Analog) signal 45 delinearizes shift register in the Register Bank 3010. These five signals are also, typically, output to the Host interface, to enable a CPU to on-line analyze the quality of the TRNG clock output. Digitized data outputs are read from the Result Store 3055 in 3050.

Figure 5:
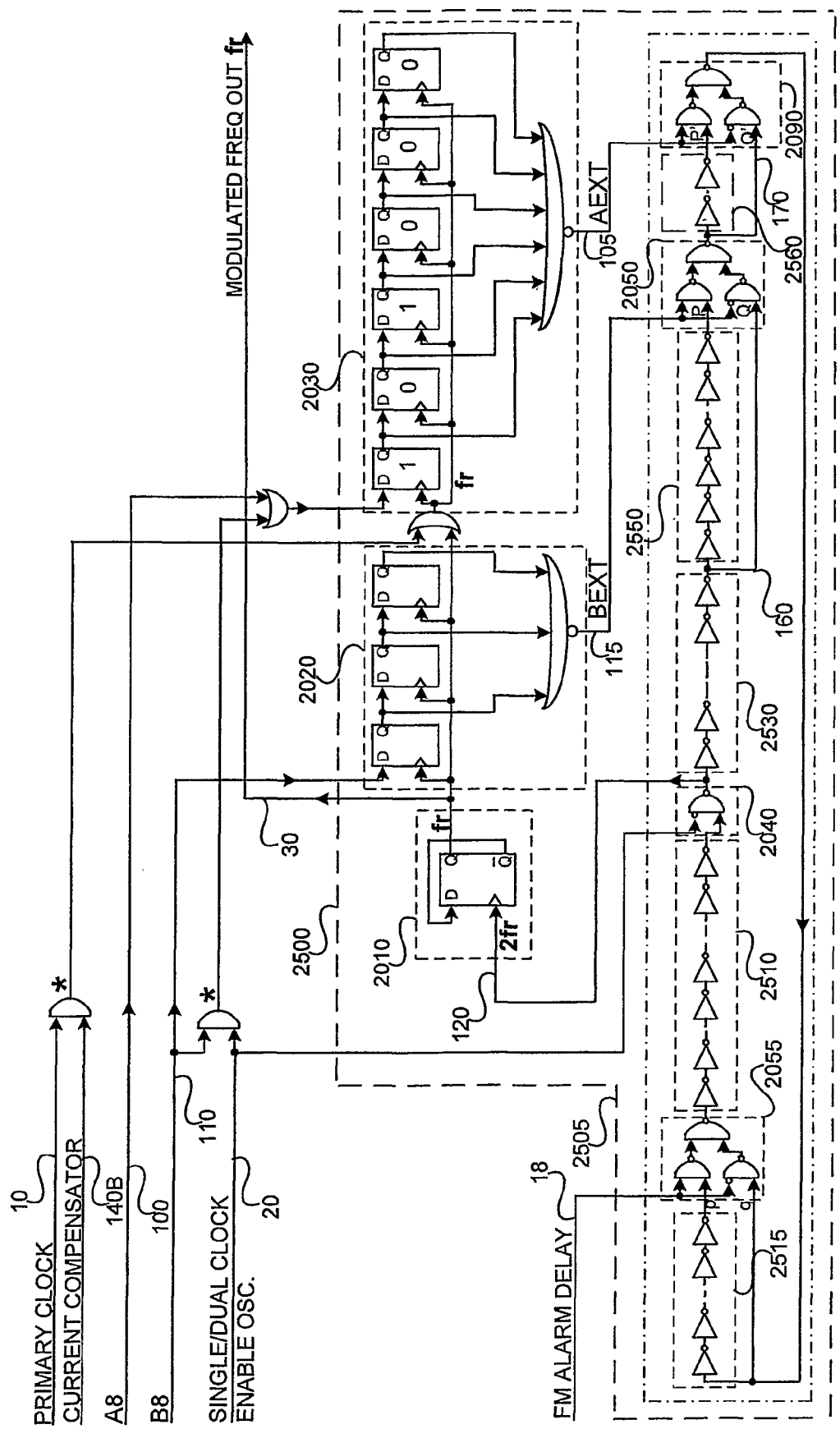
FIG. 5 is a circuit diagram of a Frequency Modulated concatenated inverter delay string ring type oscillator with onboard accelerated interval controllers triggered by outputs of the Random Modulator of FIG. 4.
Figure 6:
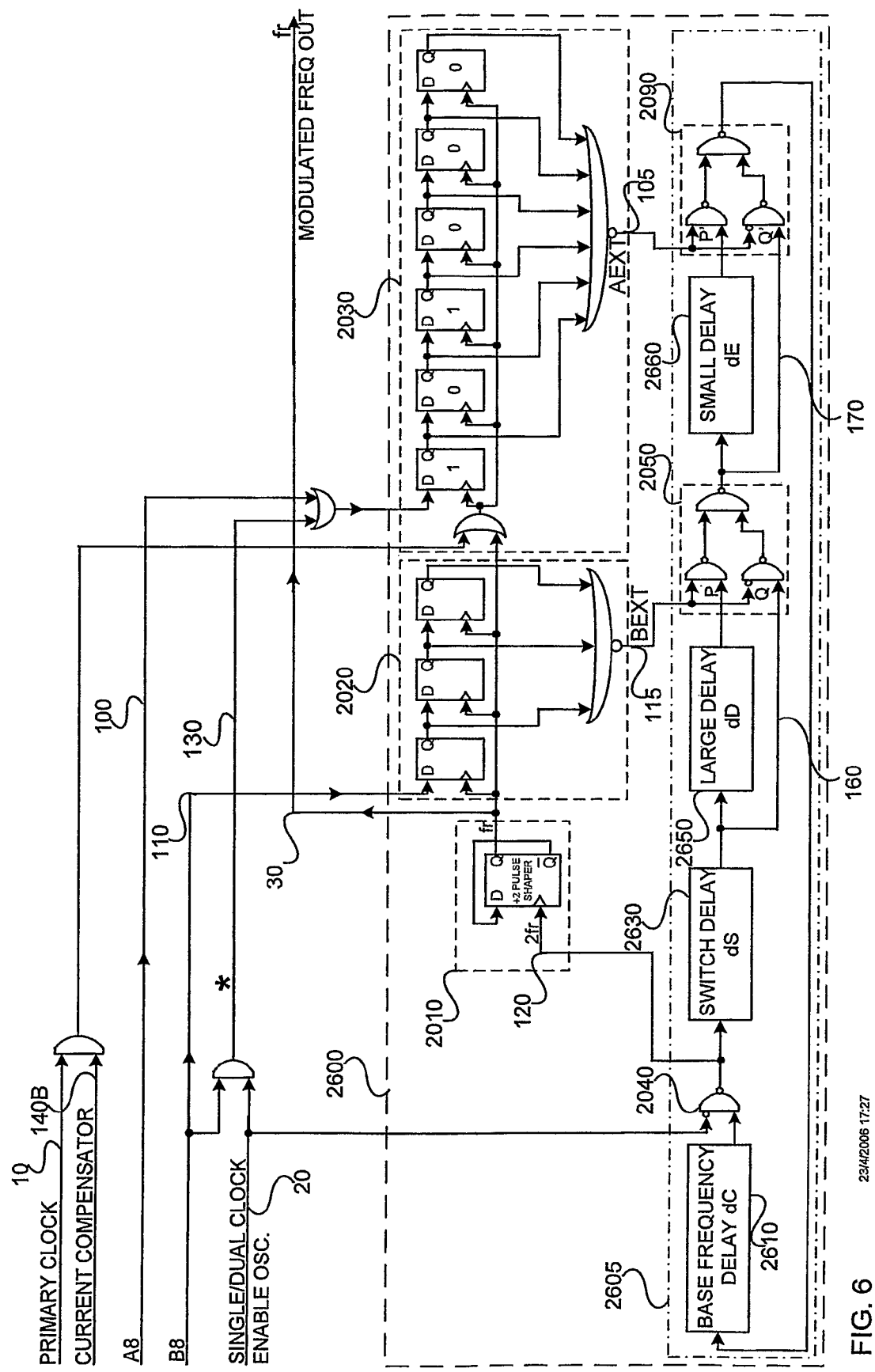
FIG. 6 is a circuit diagram of a generic Frequency Modulated concatenated delay component ring type oscillator with onboard accelerated interval controllers triggered by outputs of the Random Modulator 1300 of FIG. 4.
Figure 7:
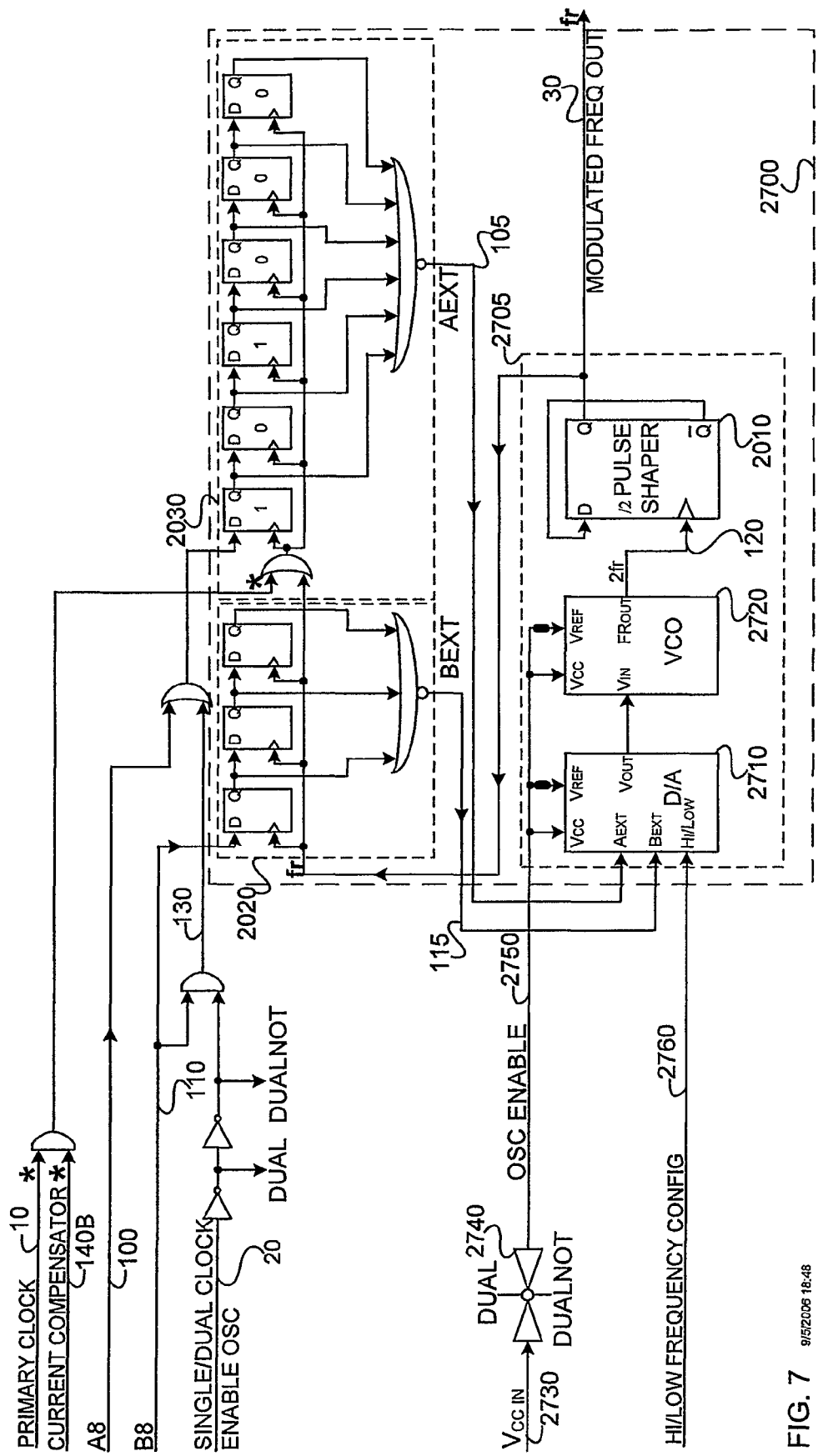
FIG. 7 is a circuit diagram of a Frequency Modulated Voltage Controlled Oscillator, with onboard accelerated interval controllers triggered by outputs of the Random Modulator of FIG. 4.

The three main blocks of the Noise Source 1000 embodiments, are:

i. the Random Frequency Modulated Oscillator with local controls 2000 whose three embodiments of oscillator circuits are described in FIGS. 5, 6 and 7 respectively, is operative to function in the Dual Clock where configuration is set on line 20 with physically generated output sequences or in Single Clock configuration, whence the Oscillator is inoperative. In Single Clock configuration the local controls balance current consumption during full chip operation. The only output of block 2000 is the complemented clock signal, fr 30;

ii. the Clock Control Logic circuit 1300 shown in FIG. 4 which outputs randomizing signals 1320B from its internal encoder 1320A to the oscillator block 2000; the parallel outputs 95 of its 9 celled Feedback Shift Register; and a random binary sequence output signal line 55 with probability of a binary "1" of about 0.67 over long periods; and which is extended to a probability of about 0.84 on the output, when ORed to an unbiased random signal;

iii. the Encoder circuitry 1630 operative in the Single Clock configuration, wherein the pseudo-randomness is supplied via the $Q_{TA}$ Debiaser 75 or in the Dual Clock configuration wherein the true randomness is provided by a feedback signal on line 50 generated by the Primary Clock's 10 sampling of the input to flip-flop F6, in output block 1680.

Host signals 3070 are initializing configuration inputs of type designated in notice 3080, in FIG. 4, which are irrelevant in the Dual clock configuration, set by the Single Clock/Dual Clock configuration signal 20. All outputs and inputs 3060 and 3070 are synchronized to the Primary Clock 10. The global Cipher Reset 60 is enacted only prior to initializing the noise source in cipher modes of operation. Current Compensator 140B enacts balancing logic, to compensate for reduced "missing signal" current consumption whence (P)Random Clock 25 is held at logic "0" for a single Primary Clock cycle. The clock switch 2010 is operative to select either the random frequency, fr, or the Primary Clock signal for random or deterministic configurations, respectively.

Figure 2B:
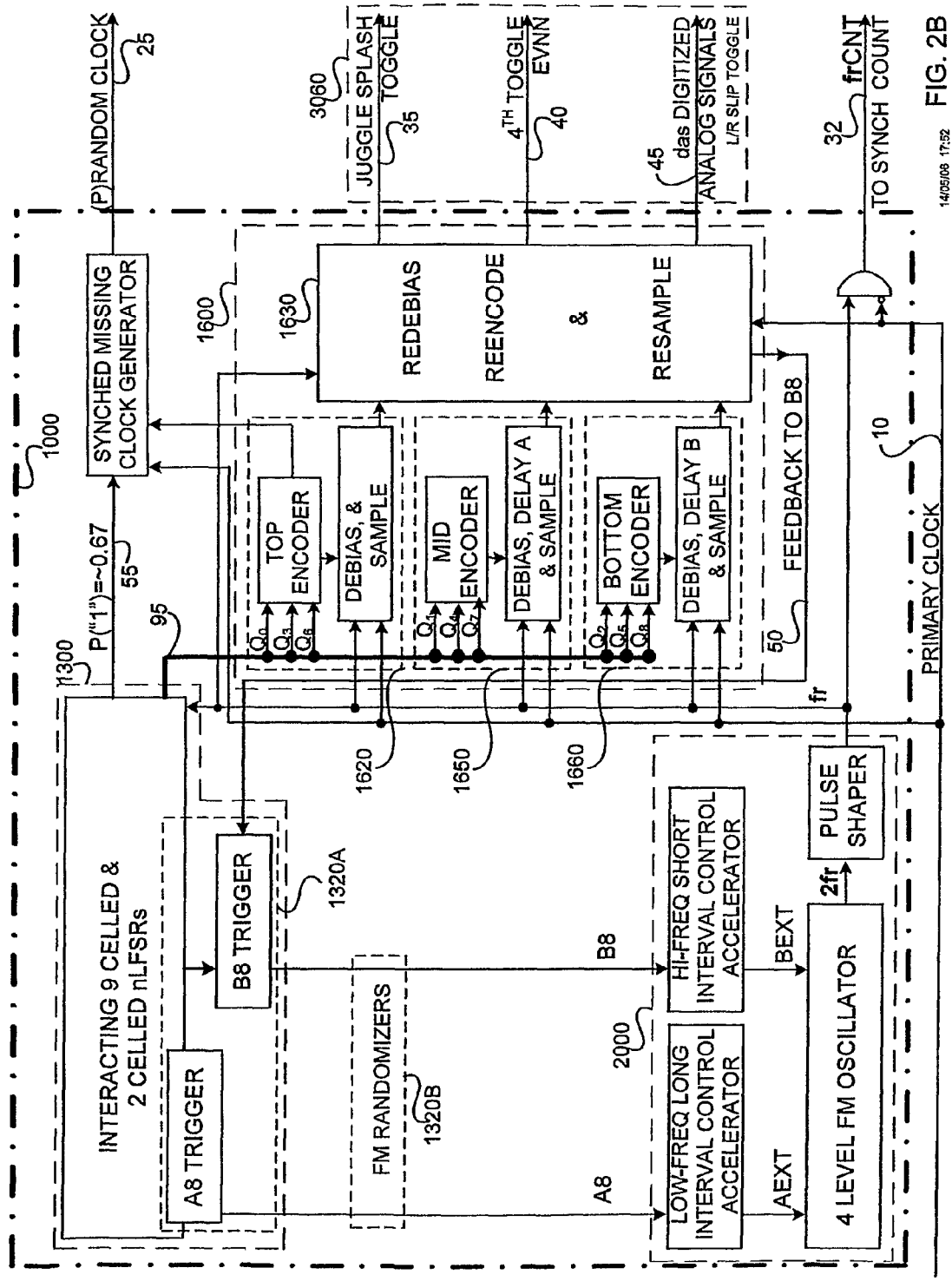
FIG. 2B is a mapping of the Random Dual Clock configuration of FIG. 2A.

FIG. 2B is a mapping of the Random Dual Clock configuration of FIG. 2A, directly into blocks of the modules relevant to True Random Number Generation in Dual Clock mode.

Figure 3A:
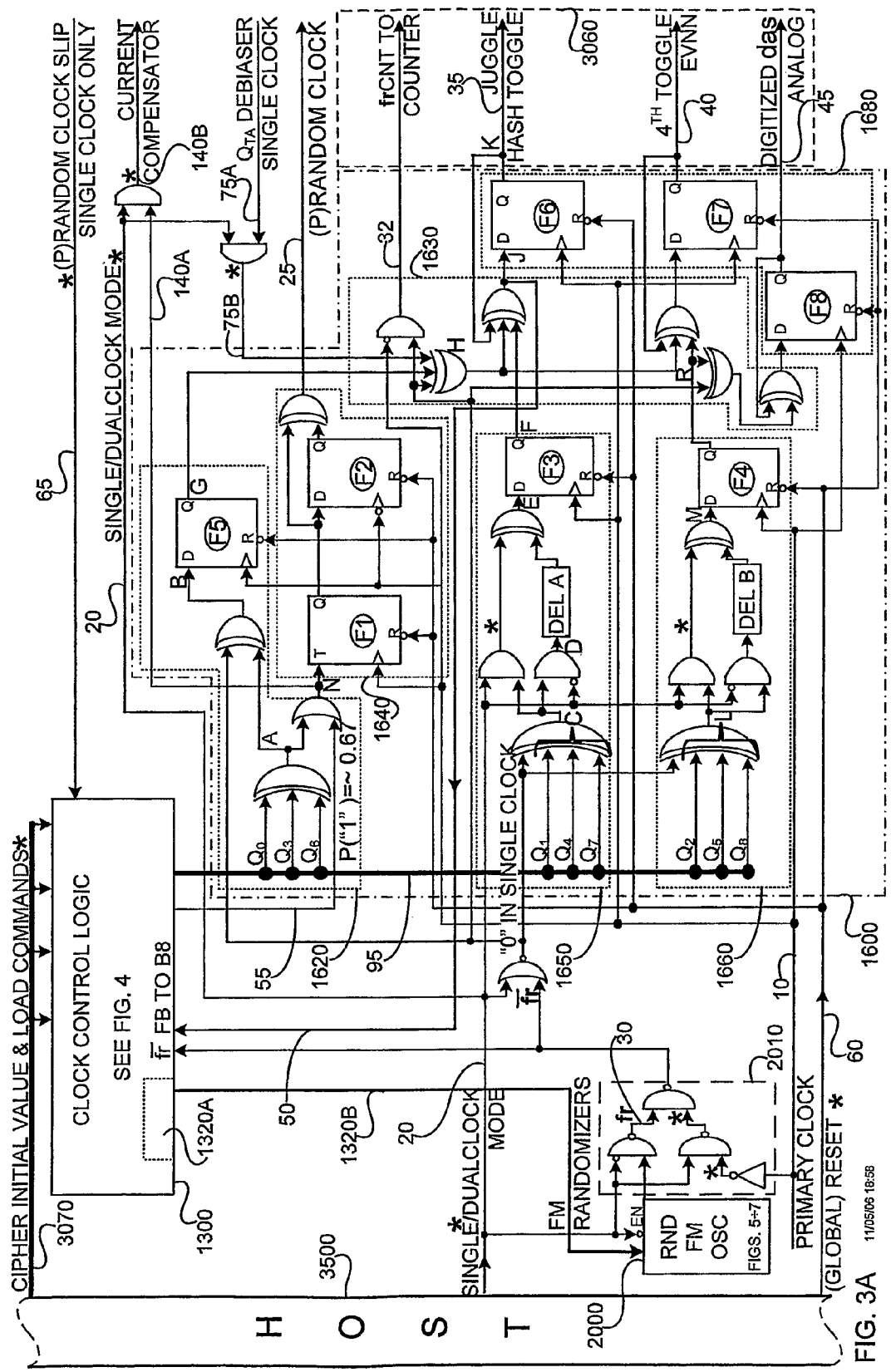
FIG. 3A illustrates the circuit of a preferred embodiment circuit of FIG. 2A, operative to encode and to output true random and pseudo-random activating signals, thereby to regulate permutation controllers in a colored random Dual Clock configuration, and also to regulate the same permutation controllers in a deterministic Single Clock configuration.

In FIG. 3A the output encoder circuit 1600 of a preferred embodiment circuit is operative to encode and output true random and pseudo-random activating signals to regulate permutation controllers in a colored random Dual Clock configuration, and also to regulate the same permutation controllers in a deterministic Single Clock configuration whose sequences are fully repeatable from any same original condition. We use the logic XOR symbol $\oplus$ in the following equations which describe the XORed internal outputs of random signals from the Feedback Register output bus 95 of FIG. 4 at points A, C and L. (The debiasing effect of fr signals is ignored in the table.)

$A = Q_0 \oplus Q_3 \oplus Q_6$; $C = Q_1 \oplus Q_4 \oplus Q_7$; and $L = Q_1 \oplus Q_4 \oplus + Q_7$.

Figure 3B:
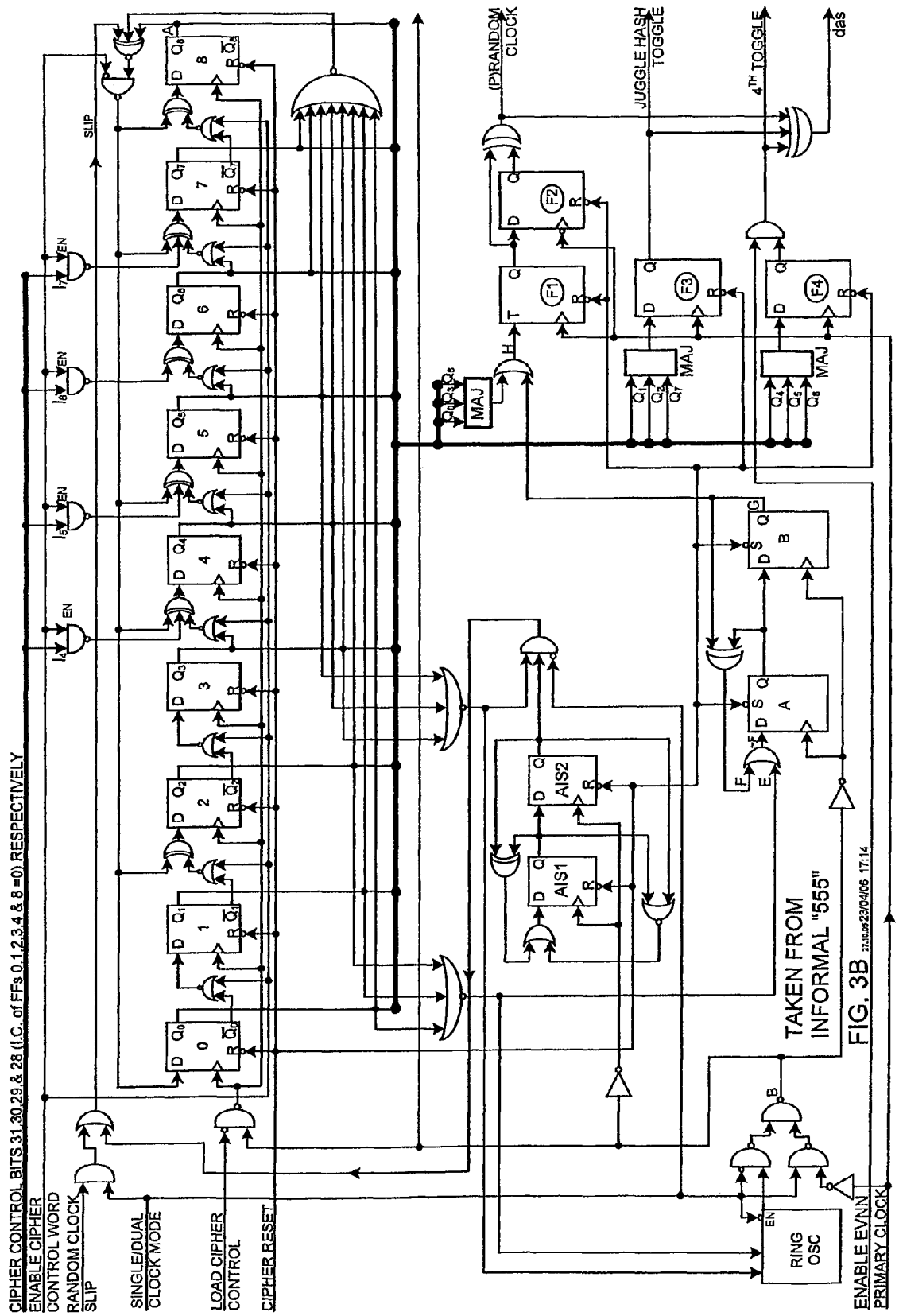
FIGS. 3B and 3C are alternate noise encoding circuits for applications that are not designed to be AIS 31 compatible.
Figure 3C:
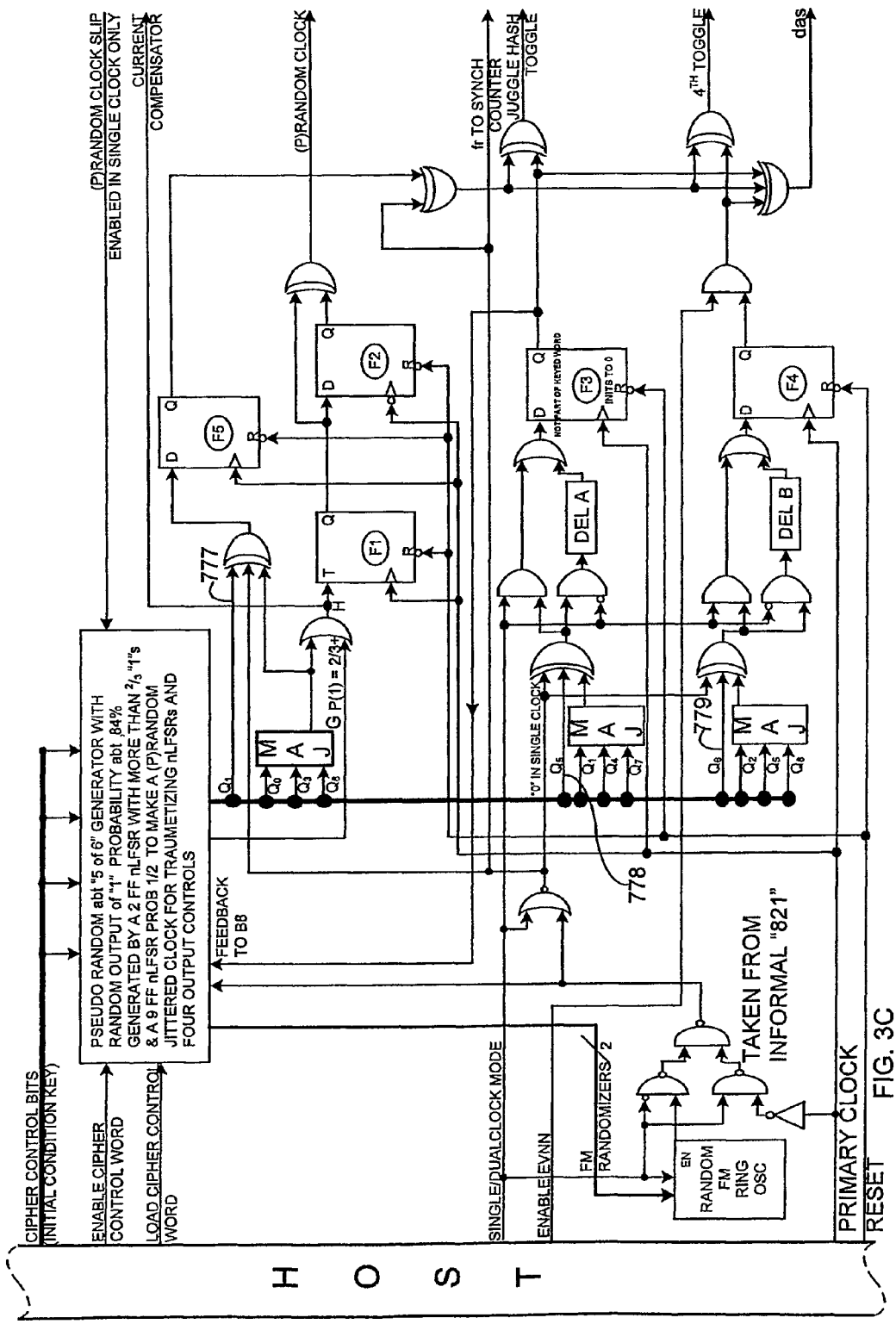

FIG. 8 illustrate the first 32 of 512 sequences appearing on bus 95 with the corresponding A, C and L signals which are debiased by the relatively unbiased fr in encoders 1620, 1650 and 1660 as is seen in FIG. 3C.

Signals C and L are subsequently each uniquely delayed in DEL A and DEL B of 1650 and 1660. Signals B, E and M are sampled at provably changing random instants (in relation to fr) by the positive edge of the Primary Clock, 10 via Flip-flops F5, F3, and F4. The uncorrelated inputs P and A are ORed to output N which consequently has a theoretical probability of being a binary "1" of approximately [0.67+½ (1−0.67)], or between 75% and 86%, in practical applications. See relevant simulated statistics in the Summary.

Circuit 1640 is a standard configuration for sampling an input, e.g., N, and outputting a pulse synchronized to the sampling clock, e.g., the Primary Clock 10, at the rising pulse of each 10 Primary clock cycle occurring when N is binary "1". Consequently, the (P)Random Clock 25 in both Single and Double Clock Configurations activates Control Units in the post-processor on an estimated average of 84% of the Primary Clocks.

Sampled signal F, 50 is physically random, as the Primary and fr oscillations are uncorrelated. Signal 50 is fed back to a Clock Control Logic circuit 1300 in 1320A, to affect via 1320B the Frequency Modulation of 2000.

Note that the output current compensator signal 140A and 140B and a debiasing input signal 75A and 75B $Q_{TA}$ are only relevant when Single/Dual Clock configuration signal 20 is logic "1"; i.e., the pulse clocking source 1000 is in the Single Clock deterministic, non-random state.

In the intermediate encoder 1630, signal G is debiased by fr in Dual Clock configuration or by the $Q_{TA}$ 75B signal in Single Clock configuration thereby outputting a relatively unbiased signal H. Signal H further debiases and randomizes signals F and R, to feed flip-flops F6, F7 and F8 which are sampled by the Primary Clock (one cycle after signals B, E and M were sampled), for the output signals Juggle Hash Toggle 35, $4^{th}$ Toggle EVNN 40 and the das signal 45, which are inherently random in the Dual Clock configuration.

In the Dual Clock configuration, fr in 3060 is typically fed to the Synchronous counter, 2500 of FIG. 1, for defined intervals, thereby showing that the varying number of fr pulses represents a truly wandering frequency. All synchronized to Primary Clock signals in random encoder 1630 are, in preferred embodiments, are also output to Host 3500 typically operative to process random statistics as prescribed in [C2002], simultaneously with or prior to sampling random words in Result Store 3055 in FIG. 1.

Block 1680, comprising flip-flops F6, F7 and F8, synchronously samples the three unbiased output signals. This intermediate block is necessary to limit propagation delays and to reduce current consumption caused by the "fluttering" H signal in the encoder, debiaser 1630 as activated in the Dual Clock configuration.

The Host also supports a Finite State Machine 3100, FSM, in FIG. 2A which is operative to receive a System Clock 5 and to generate the Primary Clock 10 sequences compliant to the specific deterministic and random functions. Typically, the Host configures the Primary Clock 10 in random number generation modes, to be free running, particularly during initialization.

FIGS. 3B and 3C illustrate embodiments designed for low power applications. In these embodiments the MAJ (Majority of 3) Function was used as the combiner of three signals of from the 9 bit eLFSR complex 1300 of FIG. 4. The principal advantage of MAJ function over the 3 input XOR function is that the MAJ is non-linear. In FIG. 3C delay circuits were added to provide phase differences between the output variables in the noise source 1000.

In FIG. 3C, signals, $Q_1$ 777, $Q_5$ 778 and $Q_6$ 779 often decreased bias in the inputs of XOR combiners.

Additional decrease of bias and consequent increase of correlation immunity is achieved via the flip-flops of output buffer 1680 FIG. 3A. The Store & XOR decorrelation and debiasing filters, which XOR combine previous cycle output with the present cycle output, by feeding back the previous signal into sampling flip-flops, as seen in F6, F7 and F8. The Store & XOR operation is a strong correlation immunizer.

The signals A8 and B8, in FIG. 4 are oscillator "kickback bits" which randomly trigger accelerations of the ring oscillators in FIGS. 5, 6 and 7.

In all preferred embodiments the outputs of (P)Random Clock 25, the Juggle Hash Toggle 35, the 4th EVNN Toggle 40 and the das AIS 31 45 signals are the outputs to the deterministic noise generators of 3605 and to the 32 bit word manipulator 3015 of FIG. 1 and are also output to the interface of the Host 3500, not shown here.

The set of commands, and the cipher control bits in the input buffer 3070 in FIG. 4 are not relevant to the TRNG Dual Clock mode of operation. Their purpose is for deterministic initialization, typically, with a secret key.

FIG. 4A depicts the Random Modulator logic 1300 of the physical frequency modulated oscillator in the TRNG Dual Clock configuration. Said modulator logic 1300 which is operative in both Single and Dual Clock configurations to generate pseudo-random or colored random sequences, respectively; and in Dual Clock configuration to trigger changes of frequency in the Random Frequency Modulated Oscillator 2000.

The interface signals 3070 and 3060 have been described previously; whereas only the input and output signals to the random modulator 1300 are relevant in the present description.

In Single Clock cipher operations, the modulator is typically initialized to a predetermined secret Host enacted setting of typically secret variables via input signals 3070. In Deterministic Random Number Generation Host initiating to a predetermined secret setting is optional.

The first step in initializing the Single Clock configuration only (line 20 set to "1") is to trigger the global Cipher Reset 60 in input block 3070. This resets to "0" all nine flip-flops in the feedback shift register 1310 and also sets flip-flops A and B in nLFSR 1330. Subsequently flip-flops 4, 5, 6 and 7 in nLFSR 1310 are typically loaded with values $I_4$ to $I_7$ and the loading signal also sets to "1" flip-flops 2 and 8 in 1310. The loading sequence comprises moving the Cipher Control Word to the Host output port, Enabling the Cipher Control Word in input block 3070, and then issuing the single pulse Delayed Load Tier/Control Word to load flip-flops 4, 5, 6 and 7 in nLFSR 1310 and to initialize to flip-flops 2 and 8 to "1".

When in Single Clock configuration, the activating clock is the Primary Clock 10, switched through the clock multiplexer 2010 of FIG. 4.

The Random Modulator logic 1300 comprises two interacting feedback shift registers; a One to Many, 9 celled non-Linear Feedback Shift Register, nLFSR 1310 with Slip signal 65 aberrations and the NOR gate for the all zero extension 1340 and the FM Oscillator encoder 1320A; and a 2 celled Linear Feedback Shift Register 1330, without the "00" stage but including a random "1" insertion mechanism.

Shift Register 1310 is a One to Many 1, 3, 4, 6, 7, 8 feedback tap configuration nLFSR with an 8 input NOR gate 1340 which forces an all "0" stage following the "000000001" stage and the "100000000" stage following the all "0" stage. Therefore, with the Slip aberration signal 65 deactivated in the Dual Clock configuration, the 512 stages of output comprise a complete pseudorandom sequence with balanced 256 "0"s and 256 "1"s, especially important with the Dual Clock configuration, where all signals noise outputs must be balanced to generate monitored statistics during TRNG generation. The first 32 output LFSR stages of 1310 starting with "11 . . . 11" are shown in FIG. 8. With Slip signals 65 in the Single Clock configuration, the all zero and all one sequences each have a more than 1/512 probability of occurring. Experience has shown that any aberration to the maximum length linear sequence causes bias and poor statistics.

The peripheral 1320A NOR gates whose inputs are five binary outputs from the 1310 shift register and a sixth input to the B8 NOR Gate from the sampled output of flip-flop F3 of FIG. 3. NOR Gates A8 and B8 each output a "1", on an average of once in eight fr cycles. The outputs from 3 input NOR Gates A8 and B8, 100 and 110, respectively are destined to the FM Oscillator controls in 2000 FIGS. 5, 6 and 7 whereas the output from A8 also inserts a "1" on the average of about once in 25 fr cycles into the sequence of shift register 1330.

In the Single Clock configuration uncertainty is gained from the typically unbiased feedback $Q_{TA}$ 75, and by the Random Clock Slip 65 with an assumed probability of a Slip "1" of about once in 30 Primary Clock cycles.

In the Dual Clock configuration, fully random wandering frequencies are typically assured by the uncertainty of feedback 50 from the Multiple Noise Source Encoder 1600 which affects the acceleration pulses from B8. The noise circuit in Dual Clock mode is autonomous in that when activated, it oscillates independently of other parts of the TRNG, and accepts no feedback from any external component. The only variable input is the Primary Clock, which may be free running or randomly sampled by the Host.

The two celled unextended (without the all "0" stage) LFSR 1330 without the A8 100 signal generates the binary sequence of two "1"s followed and preceded by one "0"; e.g., "011011011011 . . . 01101101 . . . ". As stated above, signal A8 occasionally, (estimated about one in 25 fr cycles) forces a third "1" between two lone "0"s, to generate an aberrated triple "1" sub-sequence "1011011101101 . . . " on 55.

The target of the missing pulse strategy for the (P)Random Clock signal 25 driving the Control Units in 3605:
a) To drive the control units more than 70% of the speed of the Primary Clock signal 10,
b) That the missing pulse should occur at random intervals, preferably not juxtaposed, and,
c) Despite estimations that a hacker gains irrelevant or no valuable knowledge from current consumption analysis of the lowered current energy during the ciphered deactivation of the (P)Random Clock's missing pulse, a strategy to advantageously balance current consumption when such a pulse is missing is vital. This strategy includes the Current Compensator 1408 "instructing" high current consumption tier activation in the ZK-Crypt post-processor, 3005, and also activating the unused multiple Johnson Counter 2030 (see FIGS. 5, 6 and 7) with optional tweaked additions, not shown in FIG. 5, 6 or 7 where a measured number of flip-flops could be activated in parallel with 2030, to add compensational energy expenditure during the missing pulse.

Note alert in box 3080, that signals that are marked with asterisks, are not relevant for the True Random Number Dual Clock configuration.

FIG. 5 is a circuit diagram of a Frequency Modulated concatenated inverter delay string ring type oscillator. FIG. 6 is a circuit diagram of a Frequency Modulated concatenated delay line ring type oscillator, equivalent, and in some instances as embodied with inverters as in FIG. 5. FIG. 7 is a circuit diagram of a Frequency Modulated Voltage Controlled Oscillator, where the control circuit is identical to the controls of circuits in FIGS. 5 and 6.

FIGS. 5, 6 and 7 show three preferred embodiments for Frequency Modulated (FM) oscillators, wherein each have the same controlling mechanisms for accelerating the oscillators and for expending balancing energy to compensate for reduced control current consumption during the "missing pulse" interval of the (P)Random Clock 25.

Signals marked with asterisks (*) are not active whilst the Noise Source 1000 is configured for Dual Clock activation (line 20 set at binary "0").

The signal inputs to oscillator circuits 2500, 2600 and 2700, of FIGS. 5, 6 and 7 comprise the missing pulse Current Compensator, 140B, Frequency Randomizing Signals A8 100 and B8 110, and the clock configuration enabling signal, 20. When 20 is set at "0", in the three preferred embodiments switches, 2040, and 2750 are turned on, and the relevant circuits oscillate, and a varying commensurate frequency is activated on the output, fr 30.

In the control circuits of FIGS. 5, 6 and 7, there are two Johnson Counter type interval extenders, 2020, and 2030, shifted by fr, the 2fr divided by two 2010 shaped pulse output of the oscillating circuits, 2505, 2605 and 2705.

Random modulating signals A8 100 and B8 110 generated in 1320A each generate a pulse on the average of once in 8 fr clocks.

A binary "1" A8 100 pulse input into the 6 celled Johnson Counter type shift register of 2030 causes a "0" output on line AEXT 105 for a triggered, or a "retriggered" 6 fr interval. In the example as shown in 2030, if a "1" is input into the left hand flip-flop, and two fr clocks later a second "1" retriggers the 2030 extender circuit, the "0" output interval on AEXT 105 is extended by two fr clocks; thereby enacting an 8 fr clocked interval.

A binary "1" B8 100 pulse input into the 3 celled Johnson Counter type shift register of 2020 causes a "0" output on line BEXT 115 for a triggered, or a "retriggered" 3 fr interval. In the example as shown in 2030, if a "1" is input into the left hand flip-flop, and two fr clocks later a second "1" retriggers the 2030 extender circuit, the "0" output interval on BEXT 115 is extended by two fr clocks; thereby enacting a 5 fr clock interval.

In the embodiments of FIGS. 5 and 6, "0"s on AEXT and BEXT force logic switches 2090 and 2050, respectively to select shunt lines 160 and 170; in each case reducing the signal propagation intervals in 2560 & 2660 and 2550 & 2650.

Typically, autonomous Ring Oscillators are implemented by concatenated strings of an odd number, (2n+1) of inverting logic gates, most typically simple inverters as in 2505. Final delay component circuit implementation of these circuits is negotiated with the manufacturing semiconductor fabs, to assure that the components will be sensitive to small changes of in-circuit temperatures and voltages.

To explain the sequence, start with all inverters, from the output of the polarity reversing switch 2040 to the input of 2040 at polarity "0". From this instant, "1"s are emitted from 2040 until the "new wave" of "1"s arrives at the input of 2040. The half period for "1"s to propagate from the output of inverting switch 2040 through $2n$ inverters until arriving at the input of 2040 is practically 2n times the instantaneous average rise time of a single inverter. The "falling domino like wave" of advancing "1"s which again arrives at the input of 2040 and is inverted to propagate a new wave of "0"s, which then causes a wave of falling "1"s, and so forth . . . ad infinitum. The half period for a "0" to propagate is practically 2n times the average fall time of an inverter.

Total propagation time of each inverter is the sum of the rise and fall time of all of the inverters in the string. Both the rise and fall parameters are designed to be very sensitive to voltage, temperature and to the capacitance of the output.

As the difference between rise time, $t_{PLH}$, and fall time, $t_{PHL}$ of a large capacitance inverter is often as great as 20%; causing the duty cycle percentage of (time on "1" in a single clock period) of 2fr, the ring oscillator frequency, may also be in the range of 40% to 60%. Similar duty cycle skews are inherent in 2 or 3 input low grade voltage controlled oscillators 2720, as depicted in the digitally controlled oscillator circuit 2705 in FIG. 7.

The flip-flop 2010 shapes the 2fr input pulse, and reduces the duty cycle aberration. The toggle divide by two flip-flop 2010, is operative in FIGS. 5, 6 and 7.

Oscillators 2505 and 2605 in preferred embodiments comprise five concatenated delay components, two of which, 2550 and 2560 in FIGS. 5 and 2650 and 2660 in FIG. 6 are randomly shunted, in lines 160 (to Q) and 170 (to Q') in both FIGS. 5 and 6. When a section is shunted, the half periods of 2fr are shorter [2(n−ϵ)], hence, the frequency is accelerated. Delays 2560 and 2660 are shorter (but actuated for longer periods by AEXT), hence accelerate less than delays 2550 and 2650 (which are much longer, hence typically accelerate drastically, when actuated for shorter periods by BEXT.)

Glitchless switching of selectors 2050 and 2060 is possible, only if at points P, Q, and P' and Q' inputs to 2050 and 2090 are all at binary zero. The change of polarities of BEXT and AEXT can only occur when the input to flip-flop 2010 rises from "0" to "1", as then and only then an fr pulse can shift Johnson Counters 2020 and 2030.

There is a maximum finite delay, $\tau_s$ between the rising pulse to 2010 and the actual switching of 2050 and 2090. To assure that the "1" emanating from 2040 arrives at Q of 2050 after either a BEXT (or an AEXT) switch occurs, the switch enabled delays of 2530, and/or 2630 must be longer than $\tau_s$.

2fr oscillates at the highest frequency when both signals AEXT and BEXT are "0". The period, P of 2fr is then approximately twice the sum of the propagation delays of the 2510 and 2530 of FIG. 5 and approximately twice the sum of the propagation delays of the 2610 and 2630 of FIG. 6. Consequently, the longest half period of 2 fr occurs when output signals of AEXT and BEXT are "1", and the four delay circuits are concatenated, 2510, 2530, 2550 and 2560 in FIG. 5, and 2610, 2630, 2650 and 2660 in FIG. 6.

Numbers of inverters and delays on the fr clock are all typically functions of the inverter parameters, and the intended operating frequency or range of operating frequencies. As simulations of these circuits have shown, unbiased, practically equivalent noise source distribution statistics are achieved when the ratio of fr to the frequency of the Primary Clock wanders in any practical ratio. When the instantaneous average fr frequency is more than 150 times higher than the stable free running Primary Clock frequency; or when the average fr frequency is in the same frequency range as the free running Primary Clock, the statistics are very good. Lower frequency fr entails more delay hardware, but typically less power consumption in the noise source.

The preferred embodiment of the oscillating circuit of FIG. 7 is conceptually simpler than the more complicated switching circuits of FIGS. 5 and 6. The FM modulated circuit is controlled identically to the circuits of FIGS. 5 and 6. A logic "0" on Clock configuration line 20 "closes" switch 2740, powering up oscillator 2705 on line 2750.

Digital to analog circuits configured like 2710 with 4 and 8 predefined outputs are well known in the art, as are voltage controlled oscillators, 2720. The hardware of the oscillators of FIGS. 5, 6 and 7, are typically sensitive to ambient temperature and miniscule changes of input voltages, whereas typically all components are unique, with parameters that change over time. A flip-flop with a reasonably good duty cycle, where the time on one is close to 50%±1%, e.g., 49% duty cycle, serves as an adequate pulse shaper 2010, where the rise and fall time are negligible and the slopes of fr are sharp.

Inputs AEXT 105 and BEXT 115 cause typically four levels of unstable voltage which is input into a simple typically non-linear voltage to frequency converter (aka voltage controlled oscillator) 2720, generating the 2fr 120 frequency.

The FM Alarm Delay Command 18 in FIGS. 5 and 7 toggles the base frequency ranges of oscillators 2505 and 2705. Command 18 enables frequency changes in those instances where C2002 type statistics are above a reasonable threshold; e.g., the mark of demerit, MD, is larger than 65.

As declared in "555" and "821", the rise and fall times of inverters are functions of voltage, gate temperature and fab technology at a given temperature; fabs quote ±20%.

An example with assumptions:

if the sum of the longest rise and fall times of an inverter is 0.1 nano sec, $P=10^{-10}$ s, and assume that the primary clock is set at 100 MHz, and that a minimum ring oscillator output, fr, after divide by 2 is about 91 MHz, the frequency of fr=0.91 $10^7$ and the FM-oscillator circuit's frequency is 2fr=182 MHz (=1.82 $10^8$).

2fr=1/nP=where n=number of inverters (odd), and $P=10^{-10}$ seconds.

n≅½frP=1/(1.82×$10^8$×$10^{-10}$)=1/(1.82×$10^{-2}$)≅55 inverters.

Accounting for overlaps, and decreased intervals at higher frequencies; the frequencies of fr will be about:

fr (A8=B8="0")≅−½nP=1/[2 (55) (10−10)] 1/s≅91 MHz for about 22.5% of a long interval;

fr (A8="1"; B8="0")≅1/[2 (55−2) (10−10)] 1/s≅94 MHz. for about 45% a long interval;

fr (A8="0"; B8="1")≅1/[2(55−6) (10−10)]1/s≅102 MHz. for about 12.5% of a long interval; and, fr (A8="1"; B8="1")≅1/[2(55−8) (10−10)]1/s≅106 MHz. for about 20% a long interval.

FIG. 8 is a table of the first 32 out of 512 stages (starting with the all "1" stage) of the one to many extended linear feed shift register, eLFSR 1310 of FIG. 4, wherein each of the three extended LFSR output triplets from 95 in FIG. 3 are encoded in A, C and L, and are shown after debiasing by oscillator output fr and C and L are delayed prior to sampling at points B, E, and M.

We claim:

1. Noise source apparatus operative in conjunction with host apparatus generating, at intervals, a sampling clock which samples at least one output variable at a host sampling frequency, the apparatus comprising:

a) a randomly activated deterministic pseudorandom number generating device operative to generate a first plurality of randomized binary streams;

b) a frequency modulated oscillator operating at a second plurality of binary metastable frequency levels, at least some of which are uncorrelated to the sampling clock, the oscillator being operative to activate the pseudorandom number generating device;

c) a frequency modulator circuit which is controlled by the pseudorandom number generating device and which generates oscillator input signals which define random intervals in the course of which the oscillator switches between its second plurality of binary frequency levels; and d) an encoding-sampling device receiving, encoding and sampling, in accordance with the sampling clock, the first plurality of randomized binary streams, thereby to generate at least one encoded sampled output, and feeding back an intermediate fed-back signal to the randomly activated deterministic pseudo-random number generating device.

2. Apparatus according to claim 1 wherein the encoding-sampling device comprises a double-encoding double-sampling device receiving, double-encoding and double-sampling the first plurality of randomized binary streams.

3. Apparatus according to claim 2 wherein said double-encoding double-sampling device comprises digital logic and an array of buffers serving said digital logic operative to encode, debias and sample and then re-encode, re-debias and re-sample said first plurality of randomized binary streams.

4. Apparatus according to claim 1 wherein said first plurality of streams are encoded and complemented by an output of said oscillator, are further encoded, and are again sampled by said sampling clock and are output to activate permutations in the deterministic pseudorandom number generator.

5. Apparatus according to claim 1 wherein said oscillator is operative to debias samples within the first plurality of randomized binary streams before said samples are encoded by the encoding-sampling device.

6. Apparatus according to claim 1 wherein said oscillator is operative to debias samples within the first plurality of randomized binary streams after said samples are encoded by the encoding-sampling device.

7. Noise source apparatus according to claim 1 wherein:
said frequency modulated oscillator has a metastable output and is operative to generate at least two random frequency modulated levels of at least one at least almost unbiased random frequency modulated signal; and
said frequency modulator circuit is operative:
to control the at least two random frequency modulated levels of the at least one at least almost unbiased signal by generating oscillator modulating signals, and
to receive from the oscillator, and encode, said at least one at least almost unbiased random frequency modulated signal, thereby to generate at least one output variable which comprises an encoded form of said at least one at least almost unbiased random signal for sampling by the host apparatus,
said noise source apparatus also comprising at least one logic circuit with at least one binary output operative to randomly operate upon a random frequency modulator circuit.

8. Apparatus according to claim 1 wherein each of said second plurality of binary metastable frequency levels is in a range of from less than two to at least 150 times higher than the host sampling frequency.

9. Apparatus according to claim 4 and also comprising at least one delay circuit operative to generate at least one delayed signal by phase shifting at least one of said encoded complemented and further encoded plurality of streams thereby increasing phase difference between said oscillator output, said at least one delayed signal and said sampling clock.

10. Apparatus according to claim 1 and also comprising missed signal clock apparatus comprising:
a) a metastable clock generating an at least almost unbiased metastable clock output;
b) a first digitized logic circuit driven by said metastable clock output which generates a first random binary string comprising at least one encoded binary signal with an approximate probability of one half;
c) a second digitized logic circuit driven by said metastable clock output which generates a second random binary string comprising a sequence of lone zeroes each followed by a set of at least two consecutive binary ones, wherein said sequence of sets of at least two ones comprises sets of exactly two ones randomly interspersed with sets of more than two ones; and
d) synchronization circuitry operative to combine said first and second random binary strings by outputting a combined output string including a binary one at a given position in the combined output string if at least one of the elements in the same given positions within said first and second binary strings is a one; and outputting a zero if both of the elements in the same given positions within said first and second binary strings are in a zero state, such that said combined output string comprises more than two-thirds of binary ones, and so as to synchronize said combined output string to said sampling clock.

11. Apparatus according to claim 1 wherein the frequency modulator circuit is operative to generate switch-shunting control signals and wherein said frequency modulated oscillator has an instantaneous frequency and comprises an odd number of concatenated logic inverters defining an instantaneous propagation interval, at least some of which are randomly switch-shunted by said control signals, thereby lowering said instantaneous propagation interval and increasing the instantaneous frequency of said frequency modulated oscillator.

12. Apparatus according to claim 1 wherein the frequency modulated oscillator has an instantaneous frequency and comprises:
a logic inverter; and
a plurality of concatenated delay circuits, connected in a ring and defining a total propagation time of a binary signal traveling through the ring, wherein said ring is closed at one point by said logic inverter,
wherein at least one of said plurality of concatenated delay circuits is switch shunted thereby to reduce said total propagation time and to increase the instantaneous frequency of said frequency modulated oscillator.

13. Apparatus according to claim 1 wherein the frequency modulated oscillator comprises:
a digital to analog circuit emitting a first voltage at least if all of said oscillator input signals are at logic zero and emitting a second voltage at least if all of said oscillator input signals are at logic one; and
a voltage to frequency converter generating metastable outputs which are a function of at least said oscillator input signals.

14. Apparatus according to claim 7 wherein said metastable output has a frequency in a range of from less than two to at least 150 times higher than the host sampling frequency.

15. Apparatus according to claim 1 wherein said encoding-sampling device is operative to generate at least one AIS 31 compliant output stream uncorrelated to said host-supplied sampling clock.

16. A method according to claim 1 wherein said intervals are of a fixed length, the fixed length being an integer multiple of half of the period of the sampling clock.

17. A method according to claim 1 wherein first and second sequences of time intervals are identical.

18. Noise source apparatus operative in conjunction with host apparatus which at intervals generates a signal to sample at least one output variable at a host sampling frequency; the apparatus comprising:
a) a frequency modulated oscillator operating at a plurality of levels of frequency and having a metastable output frequency, the oscillator being operative to generate at least one at least almost unbiased signal;
b) a frequency modulator circuit operative:
to control the plurality of levels of frequency of the frequency modulated oscillator by generating oscillator input signals, and
to receive from the oscillator, and to encode, said at least one at least almost unbiased signal, thereby to generate at least one output variable which comprises an encoded form of said at least one at least almost unbiased signal, for sampling by the host apparatus; and c) at least one logic circuit with at least one binary output operative to randomly operate upon a random frequency modulator circuit.

19. Apparatus according to claim 18 wherein said metastable output frequency is in a range of from less than two to at least 150 times higher than the host sampling frequency.

20. Missed signal clock apparatus operative in conjunction with a host sampling device having a host clock, the apparatus comprising:
   a) a metastable clock generating an at least almost unbiased metastable clock output;
   b) a first digitized logic circuit driven by said metastable clock output which generates a first random binary string comprising at least one encoded binary signal with an approximate probability of one half:
   c) a second digitized logic circuit driven by said metastable clock output which generates a second random binary string comprising a sequence of lone zeroes each followed by a set of at least two consecutive binary ones, wherein said sequence of sets of at least two ones comprises sets of exactly two ones randomly interspersed with sets of more than two ones; and
   d) synchronization circuitry operative to combine said first and second random binary strings by outputting a binary one if at least one of the corresponding elements of the binary strings is a one; and outputting a zero if both of the corresponding elements of the binary strings are in a zero state, thereby to generate a combined output comprising more than two-thirds of binary ones, and to synchronize said combined output to said host clock.

21. A noise generating method operative in conjunction with host apparatus which at intervals generates a signal to sample at least one output variable at a host sampling frequency; the method comprising:
   using a frequency modulated oscillator operating at a plurality of levels of frequency and having a metastable output frequency to generate at least one at least almost unbiased signal;
   using a frequency modulator circuit to control the plurality of levels of frequency of the frequency modulated oscillator by generating oscillator input signals, and to receive therefrom, and encode, said at least one at least almost unbiased signal, thereby to generate at least one output variable which comprises an encoded form of said at least one at least almost unbiased signal, for sampling by the host apparatus; and
   using at least one logic circuit with at least one binary output to randomly operate upon a random frequency modulator circuit.

22. A noise generating method operative in conjunction with host apparatus comprising a host supplied sampling clock which at intervals generates a signal to sample at least one output variable at a host sampling frequency, the method comprising:
   using a randomly activated deterministic pseudorandom number generating device operative to generate a first plurality of randomized binary streams;
   operating a frequency modulated oscillator operating at a second plurality of binary metastable frequency levels, at least some of which are uncorrelated to the host supplied sampling clock and using the oscillator to activate the pseudorandom number generating device;
   controlling a frequency modulator circuit using the pseudorandom number generating device and generating oscillator input signals which define random intervals in the course of which the oscillator switches between its second plurality of binary frequency levels; and
   receiving, encoding and sampling, in accordance with the host supplied sampling clock, the first plurality of randomized binary streams, thereby to generate an encoded sampled output and feeding back an intermediate feedback signal to the randomly activated deterministic pseudo-random number generating device.

23. A method for clocking missed signals operative in conjunction with a host sampling device having a host clock, the method comprising:
   generating an at least almost unbiased metastable clock output;
   using a first digitized logic circuit driven by said metastable clock output, generating a first random binary string comprising at least one encoded binary signal with an approximate probability of one half;
   using a second digitized logic circuit driven by said metastable clock output, generating a second random binary string comprising a sequence of lone zeroes each followed by a set of at least two consecutive binary ones, wherein said sequence of sets of at least two ones comprises sets of exactly two ones randomly interspersed with sets of more than two ones; and,
   combining said first and second random binary strings by outputting a binary one if at least one of the corresponding elements of the binary strings is a one; and outputting a zero if both of the corresponding elements of the binary strings are in a zero state, thereby to generate a combined output comprising more than two-thirds of binary ones, and to synchronize said combined output to said host clock.

* * * * *